(12) United States Patent
Lloyd et al.

(10) Patent No.: US 11,709,500 B2
(45) Date of Patent: Jul. 25, 2023

(54) GATEWAY SYSTEM WITH MULTIPLE MODES OF OPERATION IN A FLEET MANAGEMENT SYSTEM

(71) Applicant: Samsara Inc., San Francisco, CA (US)

(72) Inventors: Kevin Russell Coates Lloyd, San Carlos, CA (US); James Michael Rowson, Mamaroneck, NY (US); Maxwell Anton Dergosits, San Francisco, CA (US); Elias Ray Dykaar, San Francisco, CA (US); Erin Maria Bailie, Seattle, WA (US)

(73) Assignee: Samsara Inc., San Francisco, CA (US)

( * ) Notice: Subject to any disclaimer, the term of this patent is extended or adjusted under 35 U.S.C. 154(b) by 342 days.

(21) Appl. No.: 16/848,206

(22) Filed: Apr. 14, 2020

(65) Prior Publication Data

US 2021/0318692 A1  Oct. 14, 2021

(51) Int. Cl.
| | |
|---|---|
| *H04W 4/38* | (2018.01) |
| *G05D 1/02* | (2020.01) |
| *G07C 5/00* | (2006.01) |
| *G06Q 50/28* | (2012.01) |
| *G06F 1/3287* | (2019.01) |
| *G01R 19/165* | (2006.01) |
| *H04W 4/02* | (2018.01) |

(Continued)

(52) U.S. Cl.
CPC ......... *G05D 1/0285* (2013.01); *G01R 19/165* (2013.01); *G05D 1/0297* (2013.01); *G06F 1/3287* (2013.01); *G06Q 50/28* (2013.01); *G07C 5/008* (2013.01); *H04W 4/02* (2013.01); *H04W 4/38* (2018.02); *G05D 2201/0213* (2013.01); *G06F 9/4401* (2013.01); *H04W 88/16* (2013.01)

(58) Field of Classification Search
CPC ....... H04W 4/02; H04W 4/38; H04W 84/005; H04W 88/16
USPC ........ 713/320, 310, 340, 324, 300; 370/254, 370/253, 329, 252, 278, 445, 400, 235, 370/338
See application file for complete search history.

(56) References Cited

U.S. PATENT DOCUMENTS

| | | | |
|---|---|---|---|
| 10,622,827 B2* | 4/2020 | Ichikawa | H02J 7/025 |
| 10,782,354 B2* | 9/2020 | Hsu | H02J 7/00306 |

(Continued)

OTHER PUBLICATIONS

Samsara, Inc., "VG34—Vehicle IoT Gateway", retrieved from the Internet: https://www.samsara.com/products/models/vg34, 2019, 12 pages.

(Continued)

*Primary Examiner* — Joseph Arevalo
(74) *Attorney, Agent, or Firm* — Nicholson, De Vos, Webster & Elliott, LLP

(57) ABSTRACT

A method and a gateway system of a mobile asset are described. A voltage produced by a power system of the mobile asset is monitored by a gateway system. In response to determining that a first fluctuation occurs in the voltage produced by the power system of the mobile asset over a first interval of time, the gateway system operates in a first mode. In response to determining that a value of the voltage produced by the power system of the mobile asset is less than a voltage threshold, the gateway system automatically transitions to operating in a second mode, which is different from the first mode and causes the gateway system to consume less power than when it is operating in the first mode.

27 Claims, 9 Drawing Sheets

(51) Int. Cl.
   *H04W 88/16*   (2009.01)
   *G06F 9/4401*  (2018.01)

(56) References Cited

U.S. PATENT DOCUMENTS

| | | | | |
|---|---|---|---|---|
| 2012/0110356 | A1* | 5/2012 | Yousefi | B60R 16/023 |
| | | | | 713/320 |
| 2012/0173900 | A1* | 7/2012 | Diab | H04L 12/10 |
| | | | | 713/310 |
| 2012/0224552 | A1* | 9/2012 | Feuersanger | H04L 5/0064 |
| | | | | 370/329 |
| 2015/0224845 | A1* | 8/2015 | Anderson | B60G 13/14 |
| | | | | 701/37 |
| 2017/0288413 | A1* | 10/2017 | Varadarajan | H02J 7/00 |
| 2018/0045832 | A1* | 2/2018 | Ibrahim | G08G 1/08 |
| 2018/0150086 | A1* | 5/2018 | Nobukawa | G01S 5/0263 |
| 2018/0257660 | A1* | 9/2018 | Ibrahim | G01C 21/30 |
| 2018/0364284 | A1* | 12/2018 | Kim | G01R 19/16542 |
| 2019/0193654 | A1* | 6/2019 | Ohno | G07C 7/00 |
| 2019/0252919 | A1* | 8/2019 | Ogawa | H02J 50/20 |
| 2020/0274375 | A1* | 8/2020 | Griffiths | H02J 7/0029 |
| 2020/0334256 | A1* | 10/2020 | Kussmaul | G06F 16/2228 |
| 2020/0371581 | A1* | 11/2020 | Hureau | G06F 1/3206 |
| 2021/0160781 | A1* | 5/2021 | Dondoneau | H04W 36/32 |
| 2022/0063585 | A1* | 3/2022 | Tabata | B60W 20/13 |

OTHER PUBLICATIONS

Samsara, Inc., "Vehicle IoT Gateway—VG34 Datasheet", retrieved from the Internet: https://www.samsara.com/pdf/docs/vg34-datasheet.pdf, Mar. 19, 2019, 7 pages.

* cited by examiner

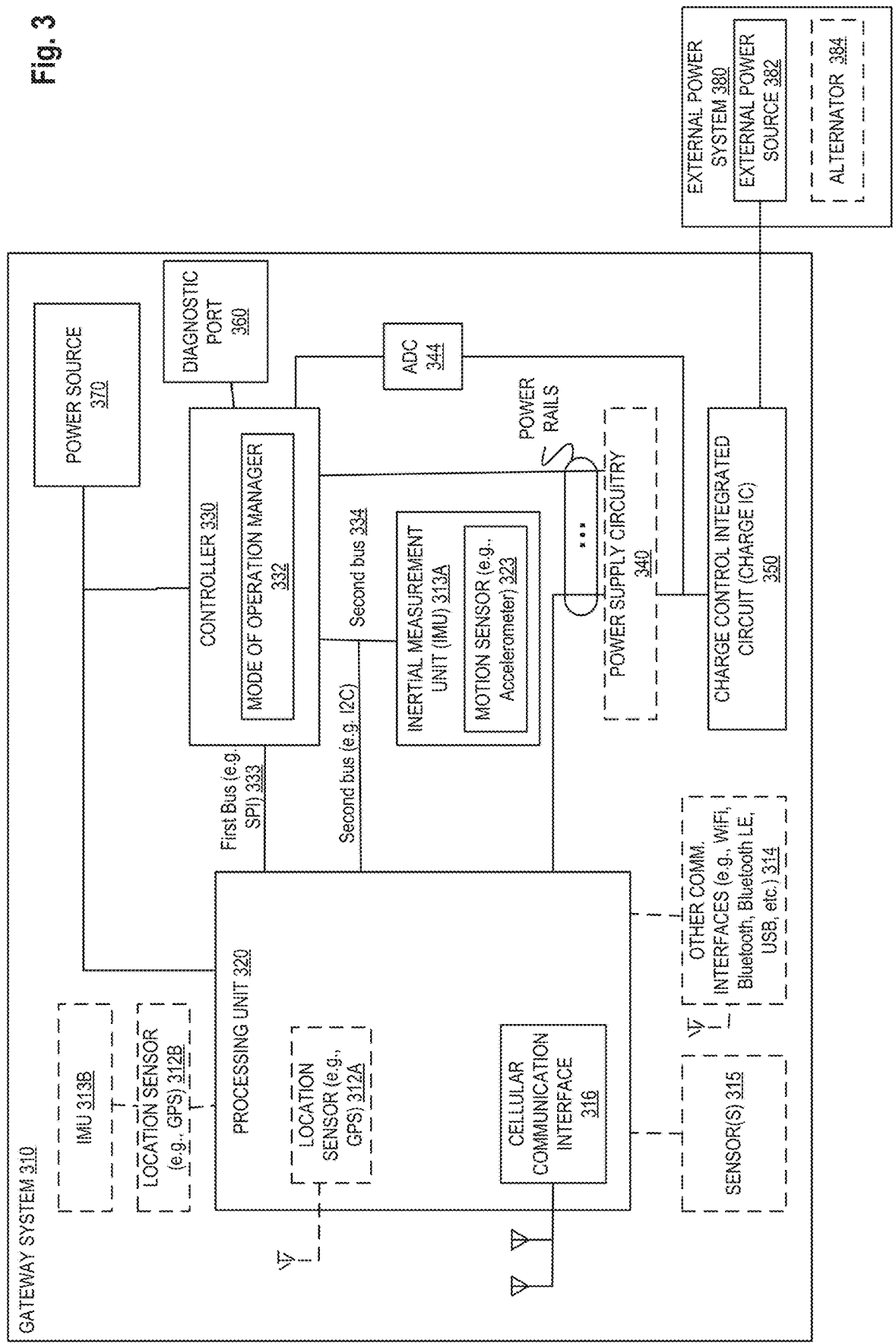

GATEWAY SYSTEM WITH MULTIPLE MODES OF OPERATION IN A FLEET MANAGEMENT SYSTEM

TECHNICAL FIELD

One or more embodiments relate to the field of fleet management; and more specifically, to a gateway system with multiple modes of operations in a fleet management system.

BACKGROUND ART

A gateway system or gateway device is an electronic device that is used to interface between local and wide area networks. A gateway system gathers data from other components such as sensors, local computing systems, and transmits the data to remote computing devices. Additionally or alternatively, a gateway system allows the remote computing devices to control and/or update the local components. The connection to the wide area network is typically a wireless connection (e.g., Wi-Fi, cellular connection, etc.). A gateway system can be mounted on a mobile asset. The mobile asset can be a truck, a trailer, a car, a snowplow, trailer dolly, storage container, dumpster, heavy machinery equipment, rail car, generator, etc.). The gateway system records and/or obtains data related to the mobile asset on which it is mounted and transmits the data to a computing device such as a server. The data transmitted is indicative of a state of the mobile asset. For example, the data can include location readings indicating the location of the mobile asset on which the gateway system is mounted. The data can include run time, fuel level, an amount of time that the engine is on. The data may further include additional sensor measurements for the mobile asset (such as temperature, humidity, etc.).

BRIEF DESCRIPTION OF THE DRAWINGS

The following figures use like reference numbers to refer to like elements. Although the following figures depict various exemplary embodiments, alternative embodiments are within the spirit and scope of the appended claims. In the drawings:

FIG. 3 illustrates a block diagram for an exemplary gateway system that can be used in some embodiments.

DETAILED DESCRIPTION

The following description describes methods and apparatus for enabling the operation of a gateway system in multiple modes of operations.

Overview

Figure 1A:
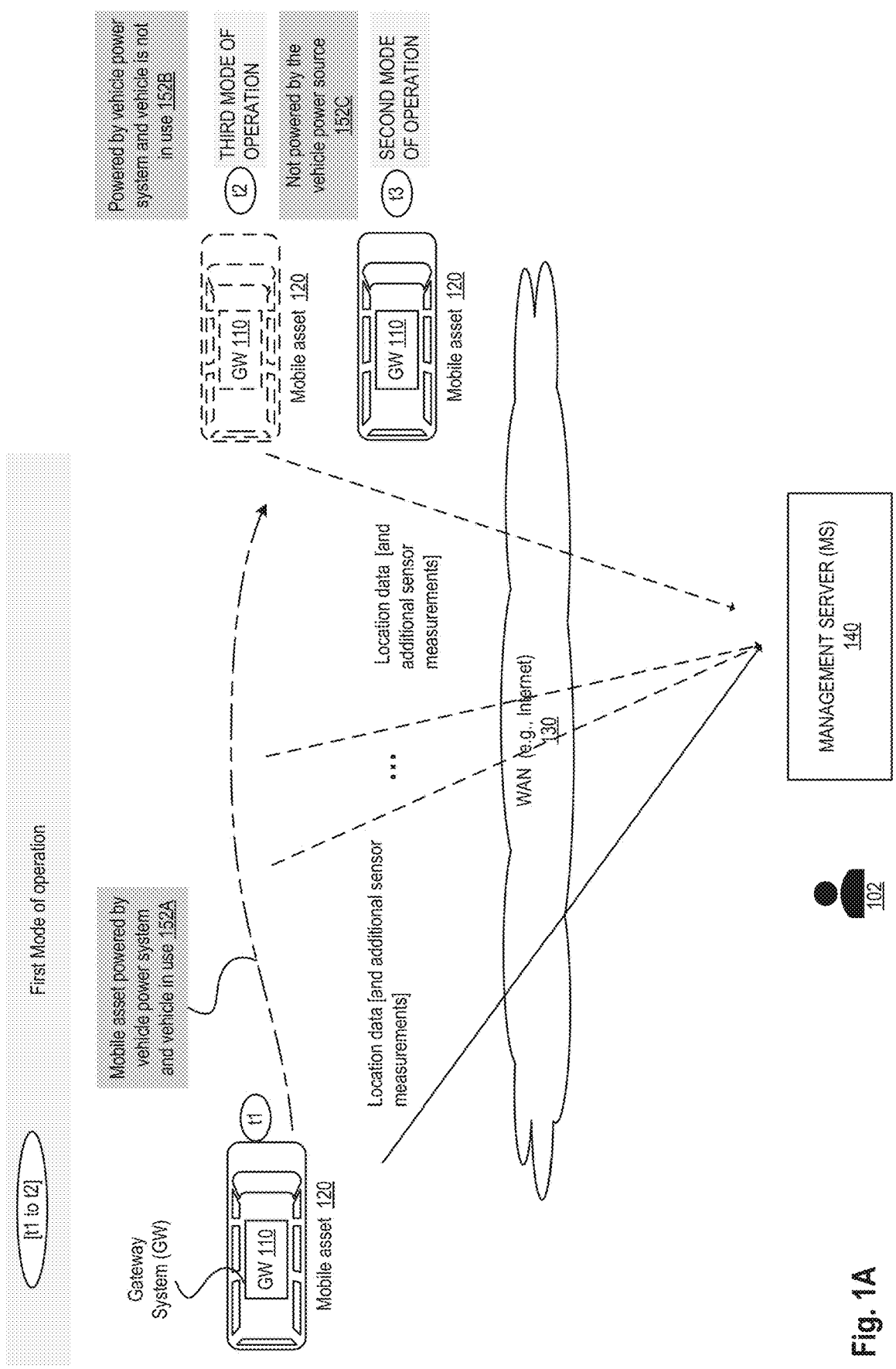
FIG. 1A is a block diagram illustrating a gateway system that is operative to operate in multiple modes, according to some example embodiments.

FIG. 1A is a block diagram illustrating a gateway system that is operative to operate in multiple modes, according to some example embodiments. The illustrated system includes a mobile asset 120 and a management server 140. The mobile asset 120 includes a gateway system 110.

The management server 140 is a cloud-based server operative to receive data from one or more gateway systems (e.g., the gateway system 110). The data received from the gateway systems is used to track the mobile asset 120 and/or to obtain insight on the state of the mobile asset 120. In some embodiments, the management server 140 is implemented as described in further details with reference to FIG. 5.

In some embodiments, the mobile asset can be part of a fleet of mobile assets tracked by a fleet management system that includes the gateway system 110 and the management server 140. In these embodiments, the fleet of mobile assets belongs to an organization. The fleet management system may belong and be operated by the organization. Alternatively, the fleet management system can belong to a third party that offers the fleet management service to the organization. In other embodiments, the mobile asset is a single mobile asset that is tracked by an individual or an organization and is not part of a larger fleet of mobile assets. The mobile asset is typically located remotely from the management server 140 and changes location over a period of time. The mobile asset can be a tractor/trailer pair. The mobile asset can be a tractor, a tow truck, a semi-truck, a light or heavy truck or any other type of mobile asset that is operative to be coupled with and pull a trailer. Alternatively, the mobile asset can be a car, a van, a bus, a specialized mobile asset, a backhoe, a bulldozer, a crane, a forklift, mobile asset, etc.

The mobile asset can be in one of two states "in-use" or "not in-use." The mobile asset is in-use when its engine is running and mobile asset is being used (i.e., the mobile asset is in motion). The mobile asset is not in-use when the engine of the mobile asset is running but the mobile asset is just idling (i.e., the mobile asset is not in motion) or when the engine of the mobile asset is not running. For example, the mobile asset 120 departs from a first location at time t1 and travel to a second location. At time t2 the engine of the mobile asset is still running but the mobile asset is idling. At time t3 at the same location, the mobile asset's engine is turned off. The mobile asset is in-use during the interval of time [t1, t2]. The mobile asset is not in-use during the interval [t2, t3] and following the time t3.

The gateway system 110 is coupled with an external power source. In some embodiments, the external power source is part of the mobile asset (e.g., a battery of the mobile asset). In other embodiments, the external power source can be other than the power source of the mobile asset. The external power source is operative to supply power to the gateway system 110. In some embodiments, the external power source can be coupled with the gateway system such that the external power source is constantly supplying power to the gateway system (regardless of whether the mobile asset is running (i.e., its engine is on) or not (i.e., the engine is off)). In other embodiments, the external power source is coupled with the gateway system such that the external power source supplies power to the gateway system only when the mobile asset is running (i.e., only when its engine is on). In another embodiment, the external power source is coupled with the gateway system such that the external power source supplies power to the gateway system when the engine is running or when the external power source is in an accessories mode; and the external power source does not supply power to the gateway system when the mobile asset is off (i.e., the engine is not running and the accessories mode is not started). In some embodiments, the external power source is put in an accessories mode via a notch to which the key inserted in a mobile asset is turned, or by pressing the ignition button without pressing the brake. In the accessories mode the external power source supplies power to some components of the mobile asset and to the gateway system 110, but the engine is not turned on such that the mobile asset cannot move.

The gateway system 110 is an electronic device that operates as an advanced sensor platform. The gateway system 110 is operative to act as a communication interface towards the management server 140. The gateway system 110 can provide a communication interface between components of the mobile asset 120 and the management server 140, a communication interface between components of the gateway system 110 itself and the management server 140, or a communication interface between third party components (e.g., sensors) that are mounted on the mobile asset and the management server 140. In some embodiments, the gateway system 110 can be built-in into a component of the mobile asset 120. Alternatively, the gateway system 110 can be a standalone system that is mounted on the mobile asset 120. In some embodiments, the gateway system 110 is designed for plug-and-play installation in a wide variety of mobile assets. In these embodiments, the gateway system 110 is operative to be coupled to one or more components of the mobile asset 120. The gateway system 110 is operative to be coupled with the management server 140 through a Wide Area Network (WAN) 130. The connection to the WAN 130 is a wireless connection (e.g., Wi-Fi, cellular connection, etc.). In some embodiments, the gateway system 110, and the management server 140, may be subject to an intermittent connectivity with the WAN. The gateway system 110 is operative to record or obtain data related to the mobile asset (e.g., data related to components of the mobile asset (such as the engine of the mobile asset) and/or data originating from sensors located on the mobile asset 120 or within the gateway system 110), and transmit the data to the management server 140. The data is indicative of a state of the mobile asset. For example, the data may include location readings indicating the location of the mobile asset on which it is mounted. In some embodiments, the data further includes additional sensor measurements for the mobile asset (such as temperature, humidity, barometric pressure, $CO_2$ concentration, acceleration, sound, etc.). The data can also include run time, fuel level, amount of time during which the engine of the mobile asset is on, etc. In some embodiments, the gateway system 110 offers a broad array of business-relevant fleet management features in an integrated, easy-to-use solution high-precision localization with real-time visibility. The gateway system 110 can be used in the context of fleet management and provide operators with real-time location and analytics, sensor data, and Wi-Fi hotspot connectivity.

In some embodiments, the gateway system 110 is operative to connect to a computing device of the mobile asset 120. For example, the gateway system 110 can be coupled to the mobile asset's computing device through an on-board diagnostics (OBD) port of the mobile asset 120. The gateway system 110 can obtain data pertaining to events that occur in the mobile asset through the OBD. In some embodiments, the gateway system 110 is operative to act as a hotspot device allowing local devices (e.g., tablets, or mobile phones, etc.) to access the wide area network through a connection to the gateway system. The gateway system 110 is powered at least in part by power received from the external power source. At any time, the gateway system 110 can be in one of two states: 1) receiving power from the external power system; or 2) not receiving power from the mobile assets power system. In some embodiments, the gateway system 110 is also operative to be coupled with one or more aftermarket devices (i.e., that are not installed by the mobile asset's manufacturer) and which are external to the gateway system 110. For example, the gateway system 110 may be coupled with one or more wireless sensing devices (not illustrated), one or more cameras, etc. The wireless sensing devices (WSDs) are electronic devices that include one or more sensors for detecting physical events (e.g., temperature, humidity, barometric pressure, $CO_2$ concentration, acceleration, pressure, sound, movement, etc.) and recording sensor measurements in response to the detection of these physical events (e.g., recording changes in temperature, movement of an object (e.g., a door being closed/opened), sudden accelerations of a mobile asset, etc.). The wireless sensing devices can be small electronic devices that are attachable to an object. The WSDs can then store the sensor measurements related to physical events detected over a period of time. The WSDs may record sensor measurements at regular intervals of time (e.g., the WSDs may detect the temperature of a room, or an object (e.g., refrigerator, food product), and record corresponding temperature measurements every N seconds or minutes). The sensor measurements are stored in a non-transitory computer-readable medium of the WSDs. Each of the WSDs is operative to be coupled to a gateway system (e.g., gateway system 110), and establish a communication channel to transfer the recorded sensor measurements. In some embodiments, each of the WSDs can connect to the gateway system through a wireless communication interface (e.g., Bluetooth Low Energy (BLE), Wi-Fi). Thus, the gateway system is operative to detect WSDs and negotiate a connection to the WSDs. In some embodiments, the gateway system 110 is implemented, as described in further details, with reference to FIG. 3 or 4.

As a state of the mobile asset can be in-use or not in-use and the gateway system can be receiving power from the external power system or not; several scenarios can occur with respect to consumption of the power by the gateway system depending on the state of the mobile asset 120 and/or the manner of installation of the gateway system on the mobile asset 120. In a first scenario, the gateway system 110 may be receiving power from the external power system when the mobile asset is in-use (i.e., when the mobile asset's engine is running and the mobile asset is being used (i.e., in motion)). In a second scenario, the gateway system 110 may be receiving power from the external power source when the mobile asset is not in-use. When the mobile asset is not in-use this is the result of the mobile asset's engine running but the mobile asset being idle, the mobile asset's engine not running but the external power system being in an "Accessories mode," which provides power from the external power system to the gateway system 110, or the mobile asset's engine not running, but the power being constantly supplied to the gateway system 110 from the external power system. In a third scenario the gateway system 110 does not receive power from the external power source and mobile asset is not in-use (engine is not running) To address the different scenarios, there is a need for a mechanism that allows the gateway system to operate in multiple modes of operation that consume more or less power from the external power source.

The gateway system 110 is operative to operate in multiple modes of operation depending on the state of operation and the way the gateway system is coupled with the external power source. The different modes of operations allow the gateway system to consume more or less power from the external power source consequently extending the life of the power source of the mobile asset as well as extending the life of any power source of the gateway system. The embodiments described herein present several advantages when compared with other mechanisms of power management for gateway systems. The mechanisms presented herein enable the gateway system 110 to use the power from the external power source without draining the external power source, and ensure that a mobile asset can be turned on even after a period of time has elapsed without the mobile asset's engine being turned on. For example, a mobile asset is able to start after 1 or 2 months of being off (i.e., without having the engine turned on) and having a gateway system connected to it. The mechanisms presented herein further allow to extend the life of the internal power source of the gateway system 110 when this internal power source is not receiving power from the external power source. In some embodiments, the gateway system 110 is operative to soft shutdown (e.g., transmitting data and a goodbye message) after its power source being completely drained, and being plugged back to the external power source for a limited amount of time (e.g., for 30 minutes or 45 minutes). Thus, the gateway system 110 is operative to charge its internal power source to a level that is sufficient to allow operations of the cellular network interface for transmission of a goodbye message to the management server 140 without a brown-out occurring in the voltage produced by the external power source. Further, in some embodiments, the mechanisms presented herein allow the gateway system to periodically turn on to transmit location information and/or sensor measurements even if not plugged to the external power source or if mobile asset is not in motion. These embodiments allow localization of a trailer and/or a mobile asset (snowplow) after a period of time (e.g., few months or few weeks) even if the mobile asset hasn't been in use for that period of time.

As it will be described in further details below, the gateway system 110 may operate in one or multiple modes of operations. For example, the gateway system 110 may operate in a first mode of operation, and in a second mode of operation. In some embodiments, the gateway system 110 may further operate in a third mode of operation. As illustrated in FIG. 1A, the gateway system 110 operates in a first mode during the interval of time t1 to t2, when the mobile asset is in-use. The gateway system 110 automatically transitions to operating in the second mode at time t3 when the mobile asset is at the second location. In some embodiments, the gateway system 110 is transitioned to operate in the second mode of operation when there is no power that is received from the external power source. In other embodiments, the gateway system 110 automatically transitions to operate in the second mode when the mobile asset has stopped (engine is not running) for a given amount of time even if the mobile asset is still receiving power from the external power source. When operating in the second mode the gateway system 110 consumes less power from the external power source than when operating in the first mode.

Modes of Operation of a Gateway System

Figure 1B:
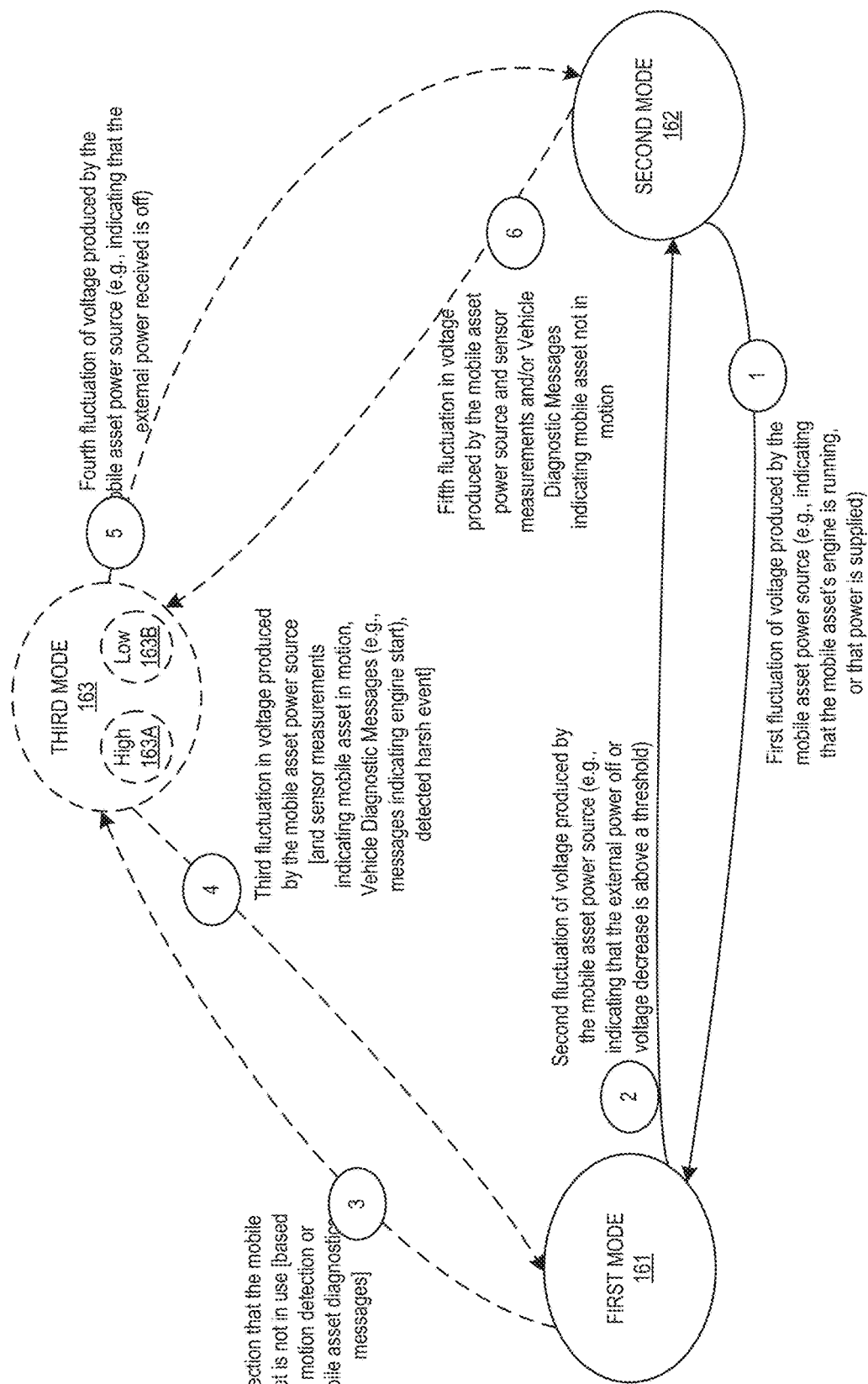
FIG. 1B illustrates a block diagram of an exemplary state diagram 160 of multiple modes of operations of the gateway system 110 and transitions between these modes of operations, according to some example embodiments.

FIG. 1B illustrates a block diagram of an exemplary state diagram 160 of multiple modes of operations of the gateway system 110, and transitions between these modes of operations. Some embodiments of the state diagram will be described with respect to the exemplary block diagram of the gateway system 110 of FIG. 3. However, this is intended to be exemplary only, and should not be regarded as a limitation of these embodiments. Other embodiments can be performed with other implementations of a gateway system 110. For example, the gateway system 110 can be implemented as the gateway system 400 of FIG. 4. In some embodiments, the gateway system 110 is operative to operate in the first mode 161 and the second mode 162. In other embodiments, the gateway system 110 is operative to operate in the first mode 161, the second mode 162, and the third mode 163. In other embodiments, the gateway system 110 may operate in the first mode 161 and the third mode 163. In some embodiments, the third mode may include two modes of operations, the high third mode 163A and the low third mode 163B. In these embodiments, a selection between the high mode and the low mode is performed to determine one of these two modes to be used as the third mode for the gateway system 110. In other embodiments, the third mode may include a single mode only, and no selection is needed.

The first mode 161 of the gateway system is a full mode of operation, where the components and the functionality of the gateway system receive power and are available. When operating in the first mode 161, the gateway system 119 receives power from the external power source. For example, when operating in the first mode all components of the gateway system 110 (e.g., all components of gateway system 310 and the components of the gateway system 410) receive power from the external power source. In the first mode 161, the cellular communication interface (e.g., comm. interfaces 316 or 428) is turned on such that data can be transmitted and received from and to the gateway system. For example, when operating in the first mode 161, the gateway system 110 can transmit a location reading of the mobile asset to the management server 140. In some embodiments, the gateway system 110 is further operative to transmit sensor measurements (e.g., temperature, accelerometer data, humidity, images, videos captured by a camera, etc.) to the management server 140 through the cellular network interfaces. In the first mode 161, other communication interfaces can be turned on such as Wi-Fi, Bluetooth LE (e.g., 314, 428, 429), and/or other communication interfaces that may not be listed herein. In the first mode, the gateway system 110 is operative to determine and record the location of the mobile asset. For example, the gateway system 110 may include a location sensor (such as a GPS sensor (e.g., 312A or 312B, or 426) for recording location readings to indicate the location of the mobile asset on which the gateway system is mounted. In the first mode the location sensor is on, and determines the location of the mobile asset at a given frequency. The frequency of determination of the location of the mobile asset can vary, and may be configurable by an owner and/or a user of the gateway system 110. In some embodiments, the gateway system 110 operating in the first mode has the following components and functionalities turned on: a location sensor, one or more short-range communication interfaces (BLE, Wi-Fi, BT, etc.), one or more additional sensors (e.g., temperature sensor, humidity sensor, IMU, etc.), one or more connection ports (e.g., Universal Serial Bus (USB), Diagnostic port (e.g., OBD), and any other Input/Output (I/O) interfaces that it may include. Further, when operating in the first mode, the power source (e.g., 421 or 330) of the gateway system is charged. When the gateway system 110 is implemented as gateway system 310, both the controller 330 and the processing unit 320 receive power from the external power system 380 and are in full operation.

When operating in the second mode 162, the gateway system 110 consumes less power than when it operates in the first mode. The second mode can be referred to as a hibernate mode. In some embodiments, when operating in the second mode the gateway system 110 consumes less power from the external power source, than it consumes in any other mode in which it may operate. In some embodiments, when operating in the second mode, the gateway system 110 does not consume any power from the external power system (e.g., the gateway system 110 is unplugged, or configured to not consume any power from the external power system). Operating in the second mode allows the gateway system 110 to consume a minimum amount of power from the external power system and/or from the power source of the mobile asset when compared with other modes of operation of the gateway system. When operating in the second mode, most components of the gateway system 110 are turned off. For example, in the exemplary implementation of FIG. 3, the controller 330, the power supply circuitry 340, and the charge control integrated circuit 350, may be turned on consequently consuming a small amount of power from the external power source over a period of time, while all other components of the gateway system 110 are turned off. the controller 330, the power supply circuitry 340, the charge control integrated circuit 350, and the IMU 313A are turned on. When operating in the second mode the gateway system 110 does not record its location. In some embodiments, when operating in the second mode 162, the gateway system 110 does not transmit a location reading of the mobile asset to the management server 140. In the second mode, the processing unit 320 is turned off. In the second mode, non-transitory computer readable media associated with the processing unit 320 are turned off. In the second mode 162, other communication interfaces are turned off such as Wi-Fi, Bluetooth LE (e.g., 314, 428, 429), and/or other communication interfaces that may not be listed herein. In the second mode the location sensor is turned off. Further, when operating in the second mode, the power source (e.g., 421 or 330) of the gateway system is not charged.

In some embodiments, in the second mode 162, the cellular communication interface (e.g., comm. interfaces 316 or 428) is turned off, such that no data can be transmitted and/or received from and to the gateway system. In some embodiments, when operating in the second mode 162, the gateway system cannot transmit any data to the management server 140. In some embodiments, when operating in the second mode 162, the gateway system 110 cannot receive any data from any external element (e.g., WSDs, mobile asset, server, etc.). Thus, in these embodiments, the gateway system 110, operating in the second mode 162, has the following components and functionalities turned off: a location sensor, one or more short-range communication interfaces (BLE, Wi-Fi, BT, etc.), one or more additional sensors (e.g., temperature sensor, humidity sensor, IMU, etc.), one or more connection ports (e.g., Universal Serial Bus (USB), any other Input/Output (I/O) interfaces that it may include, and the processing unit 320. Further, when operating in the second mode, the power source (e.g., 421 or 330) of the gateway system is not charged. In other embodiments, in the second mode 162, the cellular communication interface is not turned off (i.e., remains on) and the gateway device can receive and transmit traffic through the cellular communication interface. In some embodiments, having the cellular communication interface on or off in the second mode is configurable by a user. The user may define the second mode as Thus, in these other embodiment, the gateway system 110, operating in the second mode 162, has the following components and functionalities turned off: a location sensor, one or more short-range communication interfaces (BLE, Wi-Fi, BT, etc.), one or more additional sensors (e.g., temperature sensor, humidity sensor, IMU, etc.), one or more connection ports (e.g., Universal Serial Bus (USB), the processing unit 320, while having the controller 330 on and the cellular communication interface(s) on.

In some embodiments, the gateway system may operate in a third mode 163. The third mode of operation is a standby mode and can be viewed as an intermediate mode of operations between the full mode of operation of the gateway system (the first mode) and the hibernate mode of operation of the gateway system (the second mode). In the third mode of operation, the gateway system 110 consumes less power than when operating in the first mode 161. When compared with the second mode, the third mode allows the gateway system 110 to operate some components and/or functionalities that are turned off when the gateway system operates in the second mode 162. Thus, when operating in the third mode, the gateway system 110 is likely to consumer more power than when operating in the second mode 162 of operation.

In some embodiments, several third modes can be available for configuration of a gateway system 110. For example, two or more third modes of operations can be available for configuration of the third mode of operation. In these embodiments, the different third modes of operation may turn on or off different components and/or functionalities of the gateway system 110. The following description includes some examples of third modes (e.g., mode 163A and mode 163B) that can be implemented; however, one of ordinary skill in the art would understand that the described modes are intended to be exemplary only and should not be viewed as a limitation of the embodiments herein. In one embodiment, the third modes include a high mode 163A and a low mode 163B. When the gateway system 110 operates in the high mode 163A, it offers more functionality (e.g., more components and/or features are turned on) than when it operates in the low mode 163B. When the gateway system 110 operates in the high mode 163A it potentially consumes more power than when operating in the low mode 163B. When the gateway system 110 operates in the third mode, the operation of the location sensor may be different than when the gateway system 110 operates in the first mode. The location sensor requires less power than the power needed when the gateway system 110 is in the first mode. In one example, when the gateway system 110 operates in the third mode, the location sensor may determine location of the gateway system 110 only upon request. In contrast, when the gateway system 110 is in the first mode, the location sensor may automatically determine the location of the gateway system 110 at a predetermined frequency. In another example, the location sensor may determine location of the gateway system 110 at a first frequency that is lower than the frequency used when the gateway system 110 is in the first mode. In another embodiment, the location sensor may operate in a mode of operation that uses the same or similar amount of power than when the gateway system 110 operates in the first mode. In other embodiments, in the third mode, the location sensor is turned off and/or operates at a reduced sample rate than when the gateway system 110 is in the first mode. In some of these embodiments, the location sensor operates in a warm mode, i.e. it's not recording new location readings, but the memory of the location is kept warm such that the latest recorded location reading can be retrieved.

In some embodiments, in the high mode 163A, the cellular communication interface(s) (e.g., comm. interfaces 316 or 428) are turned on, such that data can be transmitted and received from and to the gateway system 110. When operating in the high mode 163A, the gateway system 110 may transmit and receive data to the management server 140 and other network devices through the wide area network. When operating in the high mode 163A the other communication interfaces are turned off (such as Wi-Fi, Bluetooth LE (e.g., 314, 428, 429), and/or other communication interfaces that may not be listed herein). When operating in the high mode 163A, communication through the diagnostic port is turned on. In some embodiments, when the gateway system 110 operates in the high mode 163A, the operation of the diagnostics port may be different than when the gateway system 110 operates in the first mode. In some embodiments, the diagnostics port may operate in a mode of operation that requires less power than the power needed for the mode it operates in when the gateway system 110 is in the first mode. For example, the diagnostics port may be in a monitoring mode instead of a full mode. In another embodiment, the diagnostics port may operate in a mode of operation that uses the same or similar amount of power than when the gateway system 110 operates in the first mode. In some embodiments, the gateway system 110 operating in the high mode 163A has the following components and functionalities turned off: one or more short-range communication interfaces (BLE, Wi-Fi, BT, etc.), one or more additional sensors (e.g., temperature sensor, humidity sensor, IMU, etc.), one or more connection ports (e.g., Universal Serial Bus (USB), any other Input/Output (I/O) interfaces that it may include. In some embodiments, the gateway system 110 operating in the high mode 163A has the following components and functionalities turned on: cellular communication interfaces, the diagnostics port, and the processing unit 320. Operating in the high mode 163A allows the gateway system 110 to consume potentially more power than when the gateway system 110 is in the low mode 163B or the second mode 162, but less power than when the gateway system 110 operates in the first mode 161.

In some embodiments, in the low mode 163B, the cellular communication interface(s) (e.g., comm. interfaces 316 or 428) are turned off, such that no data can be transmitted and received from and to the gateway system. When operating in the low mode 163B, the gateway system 110 cannot transmit any data to the management server 140. When operating in the low mode 163B the gateway system 110 cannot receive any data from any external element (e.g., WSDs, mobile asset, server, etc.). In the second mode 162 other communication interfaces are turned off such as Wi-Fi, Bluetooth LE (e.g., 314, 428, 429), and/or other communication interfaces that may not be listed herein. In some embodiments, the gateway system 110 operating in the low mode 163B has the following components and functionalities turned off: the cellular communication interface(s) (e.g., comm. interfaces 316 or 428), one or more short range communication interfaces (BLE, Wi-Fi, BT, etc.), one or more additional sensors (e.g., temperature sensor, humidity sensor, IMU, etc.), one or more connection ports (e.g., Universal Serial Bus (USB), any other Input/Output (I/O) interfaces that it may include, and the processing unit 320. Further, when operating in the low mode, the power source (e.g., 421 or 330) of the gateway system is not charged. Operating in the low mode 163B allows the gateway system 110 to consume a minimum amount of power from the external power system and/or from the power source while enabling some kind of location determination (e.g., keeping the latest recorded location reading). In some embodiments, in contrast to the second mode of operation the low mode 163B allows the gateway system 110 to operate the location determination (i.e. the use of the location sensor).

While the third mode is discussed with reference to exemplary sub-modes of operation high mode 163A and low mode 163B, in some embodiments, the third mode may include additional sub-modes that define additional intermediary modes of operation of the gateway system 110. These additional intermediary modes of operations have different components of the gateway system turned on or off. In some embodiments, these intermediary modes of operations can be dynamically defined based on user configurable parameters. Several mechanisms can be used for enabling the selection of one of a set of sub-modes (e.g., the high mode 163A or the low mode 163B) as the third mode of operation for the gateway system 110.

In some embodiments, the user/administrator of the gateway system 110 can configure (e.g., through configuration parameters transmitted from the management server 140) to use one of the sub-modes as the third mode of operation of the gateway system. The user can actively select a sub-mode by entering an identifier of the sub-mode to use as a third mode. The choice made by the user of one of the sub-modes can depend on the type of service that is desired from the gateway system 110 and the functionalities/features that need to be enabled in the gateway system. For example, if cellular communication is needed when the gateway system 110 is in the third mode, a high mode 163A is selected instead of the low mode 163B. In another example, if cellular communication is not needed, the low mode 163B is selected instead. In some embodiments, if a connection to the diagnostic port is needed a high mode is selected instead of the low mode 163B.

In other embodiments, the selection of the sub-mode to use as a third mode is automatically performed by the management server 140 upon receipt of a selection of one or more features to be enabled for the gateway system 110. For example, a user may request that the hotspot functionality be enabled for the gateway system 110 when the gateway is in full operation and when the gateway is in the standby operation. In this case, enabling hotspot causes the selection of the high mode 163A, which allows use of the cellular communication interface(s). In another example, the user may request that hotspot not be enabled for the gateway system 110, and the management server 140 automatically selects the low mode 163B as the third mode of operation of the gateway system 110. In another example, a user may request that the Wi-Fi functionality be enabled for the gateway system 110. In this case, enabling Wi-Fi causes the selection of a sub-mode that supports Wi-Fi interface being turned on. In another example, the user may request that Wi-Fi be disabled for the gateway system 110, and the management server 140 automatically selects a sub-mode as the third mode of operation of the gateway system 110 that turns off the Wi-Fi communication interface. The gateway system 110 supports an automatic selection of a third mode with varying components turned off or on based on the features and capabilities desired by a user.

The selection by a user of the type of third mode or the selection of one or more features (e.g., hotspot functionality, Wi-Fi functionality, etc.) to be supported by a gateway system 110 can be performed through a graphical use interface that allows the user to configure the gateway system 110. For example, one or more drop-down list including the multiple available sub-modes, or the features are presented to the user. The user selects one of the existing sub-modes or one or more features. In some embodiments, the selection of the type of third mode and/or the selection of a feature that causes the automatic selection of the third mode is performed for multiple gateway systems to be deployed for a single organization. In some embodiments, the same configuration (e.g., the same mode is selected for all gateway systems of the organization). In other embodiments, different configurations (different types of third modes) can be used for different ones of the gateway systems that belong to a single organization.

The gateway system 110 is operative to automatically transition from one mode to another mode of operation. In some embodiments, software executing in the gateway system 110 implement the mode transitions. In some embodiments, the software is executed by the controller 330 to transition the gateway system from operating in a low power mode where the components controlled by the processing unit 320 are powered off to a higher power mode in which power is supplied to at least one of the components controlled by the processing unit 320 to enable at least one feature provided by those components. In some embodiments, the software is executed by the processor(s) 405 to transition the gateway system 110 from operating in a low power mode where several components controlled by the processor(s) 405 are powered off to a higher power mode in which power is supplied to more components controlled by the processor(s) 405 to enable more features provided by those components.

In some embodiments, the gateway system is operative to automatically transition from the first mode 161 to the second mode 162, or from the second mode 162 to the first mode 161. In other embodiments, the gateway system is operative to automatically transition from the first mode 161 to the second mode 162, from the second mode 162 to the first mode 161, from the first mode 161 to the third mode 163 or from the third mode 163 to the first mode 161, and from the second mode 162 to the third mode 163 or from the third mode 163 to the second mode 162. The automatic transitions of the mode of operation of the gateway system 110 allow the gateway system 110 to adapt to changes of the state of the mobile asset (e.g., mobile asset in-use, or not in-use). For example, the automatic transitions of the modes of operations enable the gateway system 110 to operate in the first mode 161 when the mobile asset is running and in motion (the mobile asset is in-use). Alternatively, the gateway system 110 operates in the second mode 162 when no power is received from the external power source to the gateway system 110. The gateway system 110 may operate in the third mode 163 when the mobile asset's engine is running, but the mobile asset is not in motion or when power is received at the gateway system 110 but the mobile asset's engine is not turned on (e.g., the mobile asset is in accessories mode or the mobile asset is off but power is constantly supplied to the gateway system from the external power source).

The gateway system 110 is operative to automatically perform such transition(s) through the detection and analysis of a set of one or more inputs. In some embodiments, one such input is the voltage produced by the external power source. In some embodiments, a transition can be performed based on a fluctuation that occurs in the voltage produced by the external power source. In some embodiments, the fluctuation can be an increase in the voltage over a period of time. The increase in voltage can be a difference in the voltage produced by the external power system when the mobile asset's engine is not running as compared to when the mobile asset's engine is running. In particular, when operating properly, the external power system produces a higher voltage level when the engine is running than when it is not running. This difference in voltage is a result of the mobile asset's alternator (e.g., 384 or 484) running while the mobile asset's engine is running In some embodiments, in order for the fluctuation in the voltage to be considered an indication of a change in the operation of the engine of the mobile asset (from off to on) the period of time over which the fluctuation is determined needs to exceed a time threshold. The time threshold is configurable and may depend on the type of application that the mobile asset can be used for. For example, the time threshold can be few seconds to few minutes. If the fluctuation in voltage occurs for a period of time that exceeds the time threshold, the fluctuation of the voltage is considered an indication of a change in the state of the engine of the mobile asset. In other embodiments, a transition can be performed based on value of voltage produced by the external power source (e.g., when the value of the voltage is below a threshold).

Figure 1C:
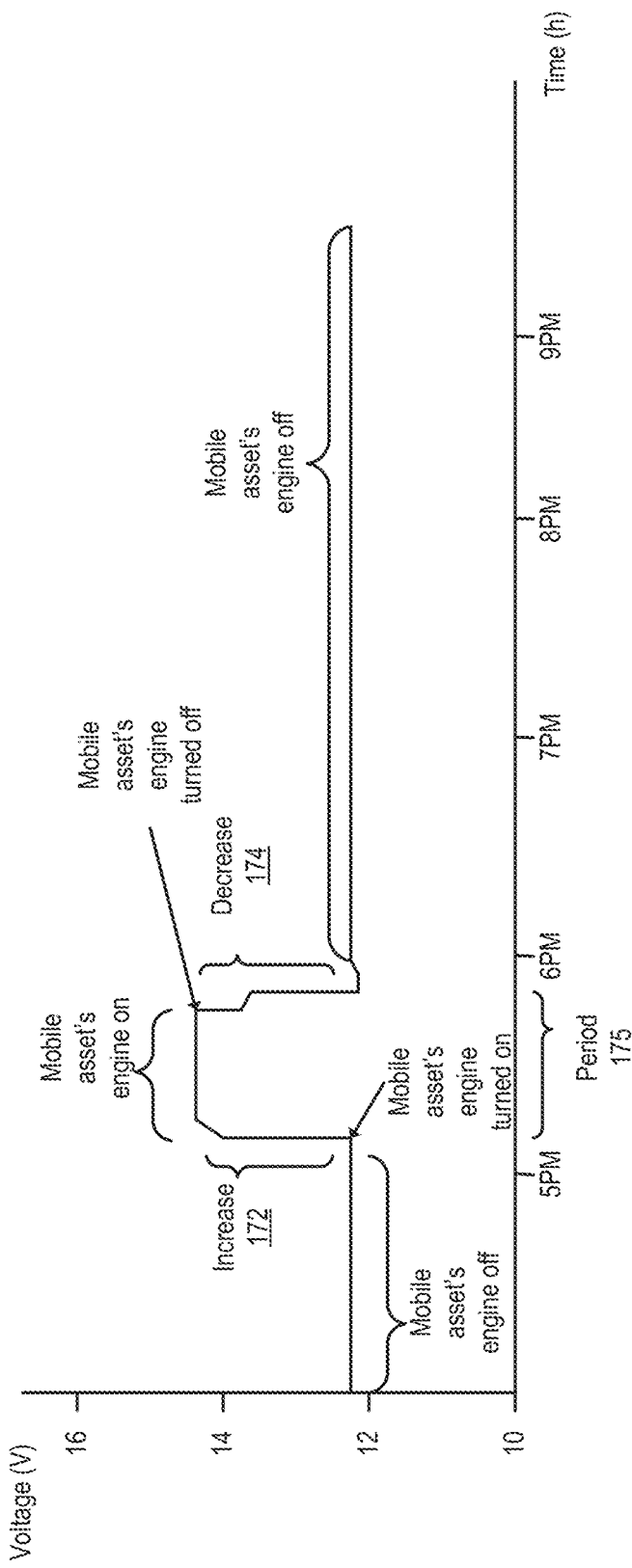
FIG. 1C illustrates a block diagram of a fluctuation in the voltage produced by an external power source, in accordance with some embodiments.

FIG. 1C illustrates a block diagram of a fluctuation in the voltage produced by an external power source in accordance with some embodiments. The voltage produced by the external power source is around 12V when the mobile asset's engine is not running and increases to above 14V when the mobile asset's engine is running. The voltage produced by the external power source is around 14V when the mobile asset's engine is running and decreases to 12V when the mobile asset's engine is not running.

In some embodiments, the detection of the fluctuation in the voltage and/or the value of the voltage produced by the external power source can be performed by the gateway system 110 through an analog to digital converter (ADC) (e.g., ADC 344) connection to a charge control integrated circuit (IC) of the gateway system 110. The ADC converts an analog signal into digital form. The gateway system 110 uses the ADC to collect information about the external power source (e.g., 382 or 482). The input signal is an analog voltage and the output is a binary number. The charge control IC (e.g., 350) receives power from the external power system. By analyzing the voltage recorded via the ADC over time, the gateway system 110 determines the value of the voltage at any given time and can detect a fluctuation in the voltage (e.g., the increase 172 from 12V to 14V, the decrease 174 from 14V to 12V, or the value of the voltage at a given time). In some embodiments, the determination of the value or the fluctuation in the voltage is performed by the controller 330.

In some embodiments, the voltage fluctuation needs to exceed a threshold within a period of time for that voltage fluctuation to be considered an indication of a transition from the mobile asset's engine not running to running or the mobile asset's engine running to not running. While in one embodiment the threshold is 2V in a 12V external power system (e.g., the increase 172 or the decrease 174 exceed the 2V threshold), in alternative embodiments the threshold is in the range of 0.5V to 3V. In mobile assets having other than a 12V power system (e.g., some electric mobile assets have a 48V power system), the threshold may be different. However, fluctuations in the voltage produced by the mobile asset's power system can occur for reasons other than the engine transitioning from not running to running Thus, the threshold is chosen to maximize true positives and minimize false positives. While some embodiments may use such a threshold voltage increase within a period of time as the only input to determine whether the mobile asset's engine has transitioned from not running to running or from running to not running respectively, alternative embodiments consider other inputs (in combination and/or independently from the voltage fluctuation). The other inputs can include the GPS signals indicating motion, accelerometer indicating motion, information from the diagnostics port indicating use (e.g., speed, movement of the wheels, movement of the steering wheel, etc.). In embodiments that consider such other inputs, the threshold is chosen to be under inclusive (detect true positives and avoid false positives) because false negatives can be detected based upon the other such inputs. In other embodiments that consider such other inputs, the threshold is chosen to be over-inclusive (detect true positives and some false positives) because the other such inputs will be used to avoid or correct false positives.

Mode Transition(s)

The operation 1 to 6 in FIG. 1B illustrates multiple transitions that can be performed by the gateway system 110 according to some embodiments. In some embodiments, only a subset of these operations is performed by the gateway system 110. For example, when the gateway system 110 is operative to operate in the first and the second mode only, the operations 1 and 2 are performed. Alternatively, when the gateway system 11 is operative to operate in the first, the second, and the third mode, the operations 1-5 or the operations 1-6 can be performed in multiple embodiments.

At operation 1, the gateway system 110 is operative to automatically transition from the second mode 162 to the first mode 161. The transition is automatically performed in response to determining that a first fluctuation in voltage produced by the external power source occurs. The first fluctuation in voltage is an increase in the voltage produced by the external power source over a period of time. In some embodiments, this increase in voltage is greater than the threshold discussed above. In some embodiments, the increase in voltage can be due to the mobile asset's engine running following a period of time in which the mobile asset's engine was not running In other embodiments, the increase in voltage can be due to power being supplied to the gateway system 110 after a period of time after which the power was not supplied (e.g., the gateway system 110 is plugged in after having been unplugged for a period of time). In some embodiments, the transition from the second mode 162 to the first mode 161 occurs in response to an internal trigger to power on (e.g., due to expiration of a timer). This internal trigger can be set for enabling the gateway system 110 to periodically transmit the location and/or other sensor measurements of the mobile asset. For example, when the mobile asset is put in storage for a long period of time (e.g., few weeks, a season, etc.), the gateway system 110 can automatically transition into the first mode for a short period of time to allow transmission of data through the cellular communication interfaces. In some embodiments, another internal trigger (e.g., expiration of another timer that is started when the transition from the second mode 162 to the first mode 161 occurs) causes the gateway system 110 to automatically transition from the first mode to the second mode after a short period of time has elapsed (e.g., 5 minutes), or after transmission of an update message is performed (e.g., a goodbye message including the location of the mobile asset). In some embodiments, the gateway system 110 may transmit to the management server 140 an indication that the transition to the first mode 161 has occurred. Upon receipt of the indication, the management server 140 may store an update to a state of the gateway system 110 in a gateway systems database (e.g., GW DB 564). In other embodiments, no indication is transmitted to the management server 140.

At operation 2, the gateway system 110 is operative to automatically transition from the first mode 161 to the second mode 162. The transition occurs in response to determining that a voltage produced by the external power source is lower than a voltage threshold. In some embodiments, for 12V power sources, the second threshold can be 10V. In other embodiments, the second threshold can be in the range of 8V to 11V. In some embodiments, the detection of the value can be due to a decrease in voltage due to the mobile asset's engine being turned off following a period of time in which the mobile asset's engine was running In this embodiment, while power may still be supplied from the external power source to the gateway system 110, the decrease in voltage indicates that the mobile asset's engine is turned off. In other embodiments, the decrease in voltage can be due to power being cut (no longer supplied) to the gateway system 110 after a period of time (e.g., the gateway system 110 is unplugged, or the engine is turned off and no power is supplied). In some embodiments, prior to transitioning to operating in the second mode, the gateway system 110 may operate in the first mode for a period of time (e.g., 1 minutes, 2 minutes, or 5 minutes) to allow transmission of any data collected (e.g., location reading, sensor data, etc.), and/or a goodbye message to the management server 140. In some embodiments, the gateway system 110 may transmit to the management server 140, an indication that the transition to the second mode 162 has occurred. Upon receipt of the indication, the management server 140 may store an update to a state of the gateway system 110 in a gateway systems database (e.g., GW DB 564). In other embodiments, no indication is transmitted to the management server 140.

At operation 3, the gateway system 110 is operative to automatically transition from the first mode 161 to the third mode 163. The transition occurs upon determination that the mobile asset is not in-use. The mobile asset is not in-use when the mobile asset is not in motion either because the mobile asset is idling, or the mobile asset's engine is turned off. The detection that the mobile asset is not in-use can be performed by determining that the mobile asset is not in motion through one or more types of inputs. The inputs can include the GPS signals indicating lack of motion, accelerometer measurements indicating lack of motion, information from the diagnostics port indicating lack of use (e.g., speed, movement of the wheels, movement of the steering wheel, etc.). The transition is automatically performed in response to determining that the mobile asset is not in-use (i.e., there is no significant motion of the mobile asset). In some embodiments, prior to transitioning to operating in the third mode, the gateway system 110 may operate in the first mode for a period of time (e.g., N minutes, N hours, etc.). In some embodiments, the transition of the gateway system 110 to operate in the third mode 163 causes the gateway system 110 to consume less power when the mobile asset is not in-use. Thus, in embodiments, where the gateway system 110 is constantly receiving power from the external power source the operation of the gateway system 110 in the third mode causes the reduction of the amount of power consumed from the external power source. In some embodiments, when transitioning to the third mode 163, the gateway system 110 may transition to one of the high mode 163A or the low mode 163B depending on which mode is configured as a third mode for this gateway system 110. In some embodiments, the gateway system 110 may transmit to the management server 140 an indication that the transition to the third mode 163 has occurred. Upon receipt of the indication, the management server 140 may store an update to a state of the gateway system 110 in a gateway systems database (e.g., GW DB 564). In other embodiments, no indication is transmitted to the management server 140.

At operation 4, the gateway system 110 is operative to automatically transition from the third mode 163 to the first mode 161. The transition occurs upon determination that the mobile asset is in-use. The mobile asset is in-use when the mobile asset is in motion (i.e., the engine is on and the mobile asset is moving). In some embodiments, the transition occurs in response to determining that a third fluctuation in the voltage produced by the external power source occurred. The third fluctuation is an increase in the voltage produced by the external power source over a period of time. In some embodiments, this increase in voltage is greater than the threshold discussed above. In some embodiments, the increase in voltage can be due to the mobile asset's engine being turned on following a period of time in which the mobile asset's engine was not running In this embodiment, while power may have still been supplied from the external power source to the gateway system 110 when the engine was off, the increase in voltage exceeding the threshold indicates that the mobile asset's engine has now been turned on. Additionally or alternatively, the detection that the mobile asset is in-use can be performed by determining that the mobile asset is in motion through one or more other types of inputs. As discussed above, the other types of inputs can be used in combination or as an alternative to the fluctuation in voltage. The inputs can include the GPS signals indicating motion, accelerometer data indicating motion, information from the diagnostics port indicating use (e.g., speed, movement of the wheels, movement of the steering wheel, etc.). The transition is automatically performed in response to determining that the mobile asset is in-use (i.e., there is significant motion of the mobile asset). In some embodiments, the transition of the gateway system 110 to operate in the first mode 161, causes the gateway system 110 to consume more power when the mobile asset is in-use (i.e., the engine is on and the mobile asset is moving) than when the mobile asset is not in-use (in which case it would operate in the second mode or the third mode). In some embodiments, the gateway system 110 may transmit an indication that the transition to the first mode 161 has occurred. Upon receipt of the indication, the management server 140 may store an update to a state of the gateway system 110 in a gateway systems database (e.g., GW DB 564). In other embodiments, no indication is transmitted to the management server 140.

At operation 5, the gateway system 110 is operative to automatically transition from the third mode 163 (e.g., from the high mode 163A or the low mode 163B depending on which mode is selected for the gateway system 110) to the second mode 162. The transition occurs in response to determining that a voltage produced by the external power source is lower than the second threshold. In some embodiments, for 12V power sources, the second threshold can be 10V. In other embodiments, the second threshold can be in the range of 8V to 11V. In some embodiments, the detection of the value can be due to a decrease in voltage due to the mobile asset's engine being turned off following a period of time in which the mobile asset's engine was running. In this embodiment, while power may still be supplied from the external power source to the gateway system 110, the decrease in voltage exceeding the threshold indicates that the mobile asset's engine is turned off. In other embodiments, the decrease in voltage can be due to power being cut (no longer supplied) to the gateway system 110 after a period of time (e.g., the gateway system 110 is unplugged, or the engine is turned off and no power is supplied). In some embodiments prior to transitioning to operating in the second mode, the gateway system 110 may operate in the third mode for a period of time (e.g., 1 minute, 2 minutes, or 5 minutes) to allow transmission of any data collected (e.g., location, sensor data, etc.) and/or a goodbye message to the management server 140. In some embodiments, the gateway system 110 may transmit an indication to the management server that the transition to the second mode 162 has occurred. In other embodiments, the gateway system 110 does not transmit the indication that the transition to the second mode 162 has occurred.

In some embodiments, the state transitions do not include the transition from the second mode 162 to the third mode. In these embodiments, when the gateway system 110 is in the second mode (i.e., the hibernate mode), the gateway system 110 can only transition to a full mode when power is supplied to the gateway system 110 from the external power source. In other embodiments, the state transitions may further include the transition between the second mode 162 and the third mode 163. At operation 6, the gateway system 110 is operative to transition from the second mode 162 to the third mode 163. In some embodiments, the transition occurs in response to determining that a fifth fluctuation in the voltage produced by the external power source occurred. The fifth fluctuation is an increase in the voltage produced by the external power source over a period of time. In some embodiments, this increase in voltage is greater than the threshold discussed above. In some embodiments, the increase in voltage can be due to the mobile asset's engine being turned on following a period of time in which the mobile asset's engine was not running In this embodiment, while power may have still been supplied from the external power source to the gateway system 110 when the engine was off, the increase in voltage exceeding the threshold indicates that the mobile asset's engine has now been turned on. Additionally, the gateway system can further determine that the mobile asset is not in motion through one or more other types of inputs. The inputs can include the GPS signals indicating lack of motion, accelerometer data indicating lack of motion, information from the diagnostics port indicating lack of motion (e.g., speed, movement of the wheels, movement of the steering wheel, etc.). The transition is automatically performed in response to determining that the fifth fluctuation in the voltage occurred and that the mobile asset is not in motion (i.e., the mobile asset is idling). In some embodiments, the transition of the gateway system 110 to operate in the third mode 163 causes the gateway system 110 to consume less power when the mobile asset's engine is on and the mobile asset is not in motion than when the mobile asset's engine is on and the mobile asset is moving (in which case the mobile asset operates in the first mode 161). In some embodiments, when transitioning to the third mode 163, the gateway system 110 may transition to one of the high mode 163A or the low mode 163B depending on which mode is configured as a third mode for this gateway system 110. In some embodiments, the gateway system 110 may transmit to the management server 140 an indication that the transition to the third mode 163 has occurred. Upon receipt of the indication, the management server 140 may store an update to a state of the gateway system 110 in a gateway system's database (e.g., GW DB 564). In other embodiments, no indication is transmitted to the management server 140.

Mode Transition(s) Conditional to the Voltage of the External Power Source being Above a Voltage Threshold Regardless of whether a transition is evaluated to be performed from a low power consumption mode (e.g., the second mode or the third mode) to a higher power consumption mode (e.g., the first mode or the second mode) due to a set of one or more external inputs (e.g., such as the fluctuation in or the value of the voltage produced from the external power source) or due to an internal input (e.g., some internal trigger indicating a desire to power on, such as expiration of a timer, a motion detected by an accelerometer, etc.), in some embodiments the transition does not occur if the voltage produced by the external power system is not above a voltage threshold that reflects a safe amount of voltage for proper operation of the gateway system 110.

A power curve represents a variation in the voltage produced by the external power source as it is charged or discharged. In some embodiments, there exist a point along the power curve for each type of external power source and/or mobile asset below which a gateway system's attempt to boot may result in a reset of the gateway system. In other words, this point represents an average voltage at which successfully booting a gateway system becomes unreliable. Thus, the voltage of the external power source needs to be a safe margin beyond the point described above for the gateway system to boot in a reliable manner In some embodiments, this safe margin takes into account the fact that the gateway system powering off will result in an increase in the voltage of the mobile asset's power system because the gateway system will no longer be drawing power. By way of a specific example, if one assumes that the gateway system powers off because the voltage produced by the external power system is too low (below the second threshold), and responsive to this powering off: 1) the voltage of the mobile asset's power system increases: 2) the gateway system attempts to boot because the gateway detects this voltage increase (fluctuation of the voltage); 3) the booting process fails because the voltage is too low; 4) and the process repeats. This "ping pong" effect is avoided, in some embodiments, by selecting a voltage threshold that is greater than the point along the battery curve described above. While in one embodiment, for a 12V external power system, the voltage threshold is 8 volts, the voltage threshold may alternatively be in the range of 7 to 12V. In mobile assets with a different voltage power system (e. g., some electric mobile assets have a 48V power system), the range would be different. While in some embodiments the voltage threshold is preconfigured or configurable by the end-user, in other embodiments different voltage thresholds are selected for different gateway systems based on a set of one or more criteria, such as different types of external power system, different types of mobile assets, different operating environments (e.g., Based upon geographic location), etc. While selection of voltage threshold may be performed in a variety of different ways, in some embodiments, a look-up table is generated that identifies different voltage thresholds based upon the set of criteria; and each gateway system determines their values for the set of criteria, and then look up the corresponding voltage threshold to use in the look-up table. This look-up table may be stored in each gateway, and optionally updated, responsive to certain events and/or a timetable. Alternatively, this look-up table may be stored in a cloud system (e.g., the management server 140), and the corresponding voltage thresholds are pushed to or pulled to each gateway system.

Thus, in some embodiments, prior to transitioning from the second mode 162 to the first mode 161, from the third mode 163 to the first mode 161, or from the second mode 162 to the third mode 163, upon detection of one or more inputs (e.g., voltage fluctuation, motion detection, timer expiration, etc.) the gateway system 110 further determines whether the voltage produced by the external power source is greater than or equal to the voltage threshold. When the voltage produced by the external power source is greater than or equal to the voltage threshold (e.g., greater than or equal to 8V), the transition is performed. Alternatively, when the voltage produced by the external power source is lower than to the voltage threshold (e.g., lower than 8V), the transition is not performed. While in some embodiments, upon determination that the voltage produced by the external power source is lower than the voltage threshold, the gateway system 110 remains in the same mode, in other embodiments, the gateway system 110 transitions to another mode that has a lower power consumption that the mode in which it is. When the gateway system 110 is in the second mode (which is considered the lowest mode in terms of power consumption), upon determination that the voltage produced by the external power source is lower than to the voltage threshold, the gateway system 110 remains in this mode. Alternatively, when the gateway system 110 is in the third mode (which is considered an intermediate mode in terms of power consumption), upon determination that the voltage produced by the external power source is lower than to the voltage threshold, the gateway system 110 automatically transitions to operate in the second mode 162, which is a lower power consumption mode when compared with the third mode.

While the transitions to a lower power mode in response to determining that the voltage produced by the external power source is less than the voltage threshold is described as occurring following an attempt of the gateway system 110 to transition to a higher power consumption mode, in other embodiments, the transition to a lower power mode in response to determining that the voltage produced by the external power source is less than to the voltage threshold can be performed regardless of whether there was an attempt to transition to the higher power consumption mode. For example, a gateway system 110, when operating in the first mode 161, or in the third mode 163, may periodically analyze the voltage produced by the external power source to determine whether the voltage produced by the external power source is lower than to the voltage threshold. In some embodiments, upon determination that the voltage produced by the external power source is lower than to the voltage threshold, the gateway system 110 automatically transitions to operate in the second mode 162, which is a lower power consumption mode when compared with the third mode 163 or the first mode 161. In other embodiments, upon determination that the voltage produced by the external power source is lower than to the voltage threshold, the gateway system 110 automatically transitions from the first mode 161 to the third mode 163, which is a lower power consumption mode when compared with the first mode 161.

In some embodiments, the voltage threshold is configurable by a user (the user or administrator of the gateway system 110). For example, the voltage threshold can be input by the user at the time of configuration of the gateway system 110. The voltage threshold can be selected by the user in the interest of forcing a transition to a lower power consumption mode earlier than a default transition set up in the gateway system. This causes the gateway system 110 configured with the custom voltage threshold to save more battery energy than when the gateway system 110 operates with a default voltage threshold.

Figure 1D:
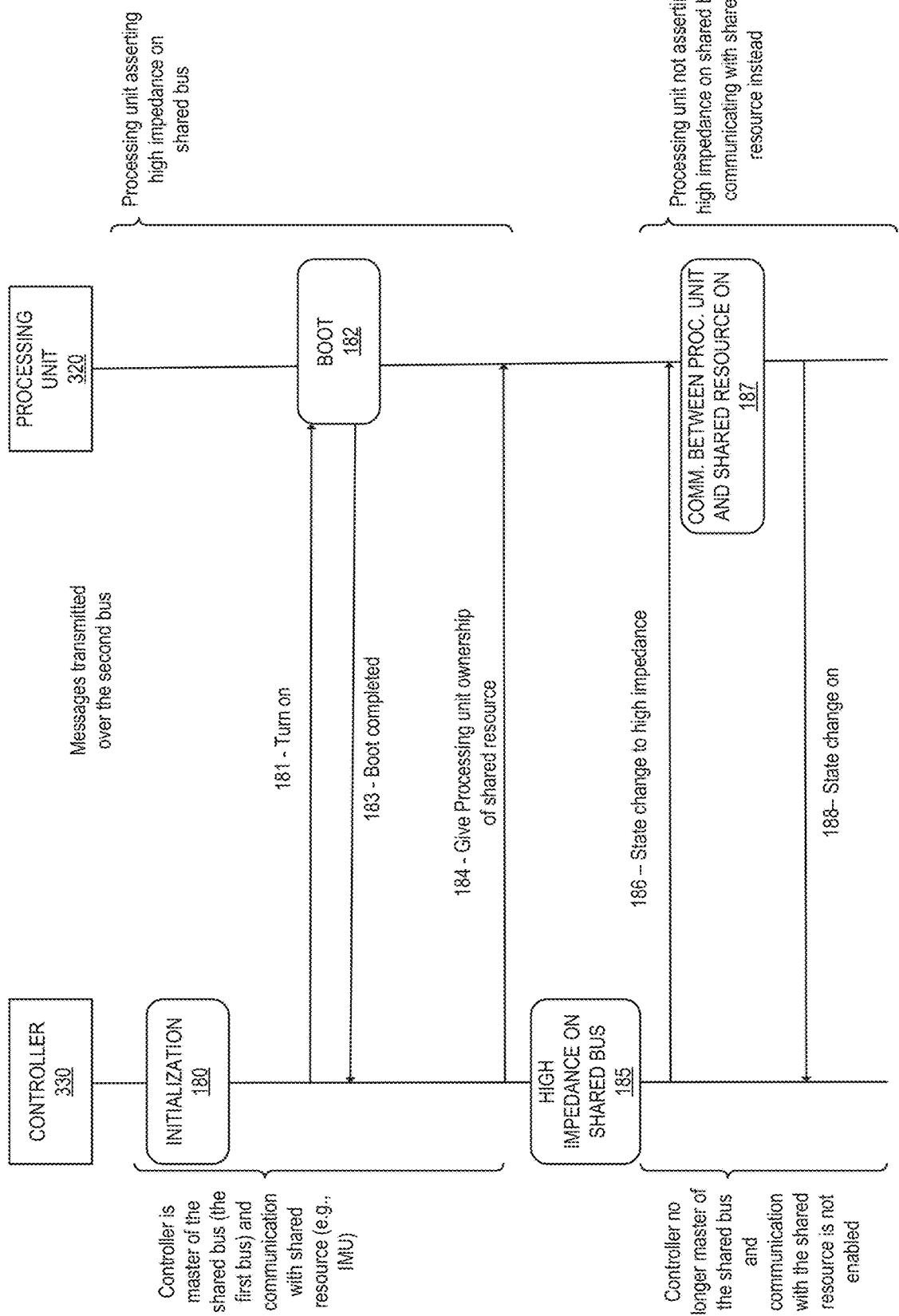
FIG. 1D illustrates a block diagram of exemplary operations for enabling mode transitions when components of the gateway system share a resource, in accordance with some embodiments.

Mode Transition(s) with Shared Resource:

FIG. 1D illustrates a block diagram of exemplary operations for enabling mode transitions when components of the gateway system share a resource, in accordance with some embodiments. The embodiments herein are described with respect to the gateway system 110 implemented as a gateway system 310. In this implementation, the gateway system 310 includes two units that can be used to control the operations of the gateway system 310 in the different modes of operations: the processing unit 320 and the controller 330. In some embodiments, the gateway system 310 includes a hardware resource that is shared by both the controller 330 and the processing unit 320. In a non-limiting example, the shared resource is an IMU. The IMU is coupled with each one of the controller 330 and the processing unit 320 through a shared bus, the second bus 334. The controller 330 and the processing unit 320 are further coupled through another bus, the first bus 333 that is separate from the second bus 334. In some embodiments, the operations described with reference to FIG. 1D are performed to enable the controller 330 to pass control of the IMU 313A and the second bus 334 to the processing unit 320 and vice versa. These embodiments can be used in combination with or independently of one or more of the embodiments described above with respect to mode transitions of the gateway system 110 when implemented as gateway system 310. For example, when the gateway system 310 operates in a mode where the processing unit is turned on, the control of the IMU 313A and the second bus is given to the processing unit 320. Alternatively, when the gateway system 310 operates in a mode where the processing unit is turned off, the control of the IMU 313A and the second bus 334 is given to the controller 330.

When the gateway system boots up, at operation 180, the gateway system 310 default to having the processing unit 320 asserting a high impendence on the first bus that is shared between the processing unit 320 and the controller 330, and having the controller 330 being a master (i.e., in control) of the second bus and the communication with the shared resource. If the gateway system 310 operates in a mode in which the processing unit 320 is on, the controller transmits through the first bus 333, a message 181 causing the processing unit 320 to turn on. The processing unit 320 boots up and transmits a message 183 indicating that the boot process is completed. During these first operations, the controller 330 is master of the shared bus (the first bus) and communication with shared resource (e.g., IMU). Upon determination that the boot process of the processing unit 320 is completed, the controller 330 transmits a message 184 through the first bus 333 to give the processing unit ownership and control over the shared resource and the shared bus. The controller 330 imposes a high impedance on the shared bus 185 causing the controller 330 to no longer be a master of the shared bus such that communication with the shared resource is not enabled. The controller 330 transmits a message 186 to the processing unit 320 indicating that there is a change in state to high impedance. The message causes the communication between processing unit 320 and the shared resource to be turned on (operation 187). The processing unit 320 no longer asserts a high impedance on the shared bus enabling communicating with the shared resource instead. The processing unit 320 transmits a message 188 to the controller 330 indicating that there is a change in state to low impedance. In some embodiments, the control of the shared resource is released back to the controller 330 when a transition occurs towards the second mode 162 (the transition can be from the first mode 161 to the second mode 162 or from the third mode (163A or 163B) to the second mode 162). In other embodiments, the control of the shared resource is released back from the processing unit to the controller 330 when a transition occurs from the first mode 161 to the third mode 163 (for example, when the third mode is the low mode 163B in which the processing unit 320 is turned off).

These embodiments enable the processing unit 320 and the controller 330 to share a resource, consequently reducing the cost of the gateway system 310, while enabling the gateway system to operate in multiple modes of operations, at least in part, based on the inputs received from this shared resource. In particular, the inputs received from the shared resource allow the controller 330 to detect motion or lack of motion. While the embodiments herein present the IMU the resource shared between the controller 330 and the processing unit 320, in other embodiments, a different resource can be shared, and a similar mechanism can be performed to enable the two components to share the resource.

Figure 2A:
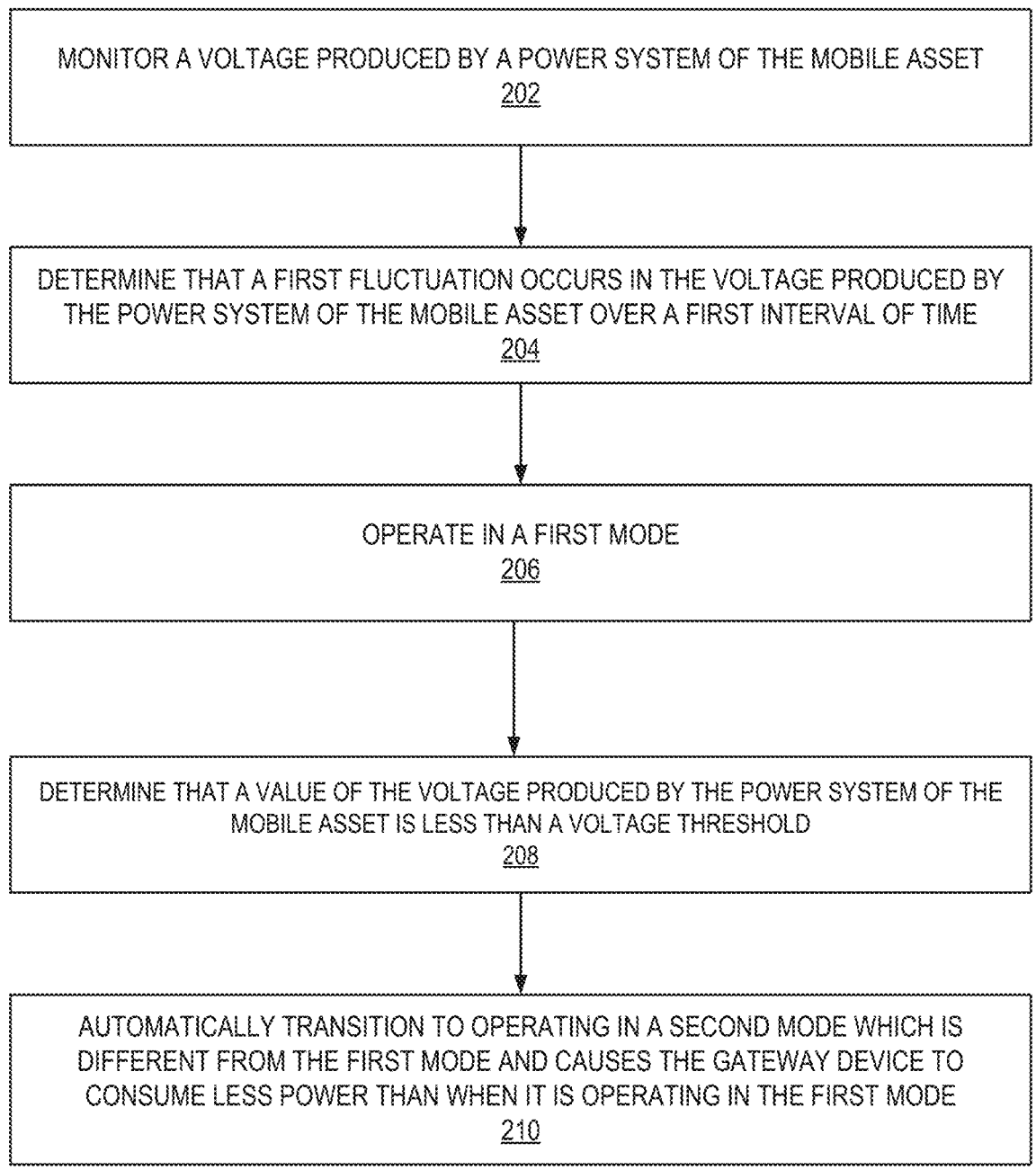
FIG. 2A illustrates a flow diagram of exemplary operations that can be performed in a gateway system for transitioning from a mode of operation to another mode of operation of the gateway system, in accordance with some embodiments.
Figure 2B:
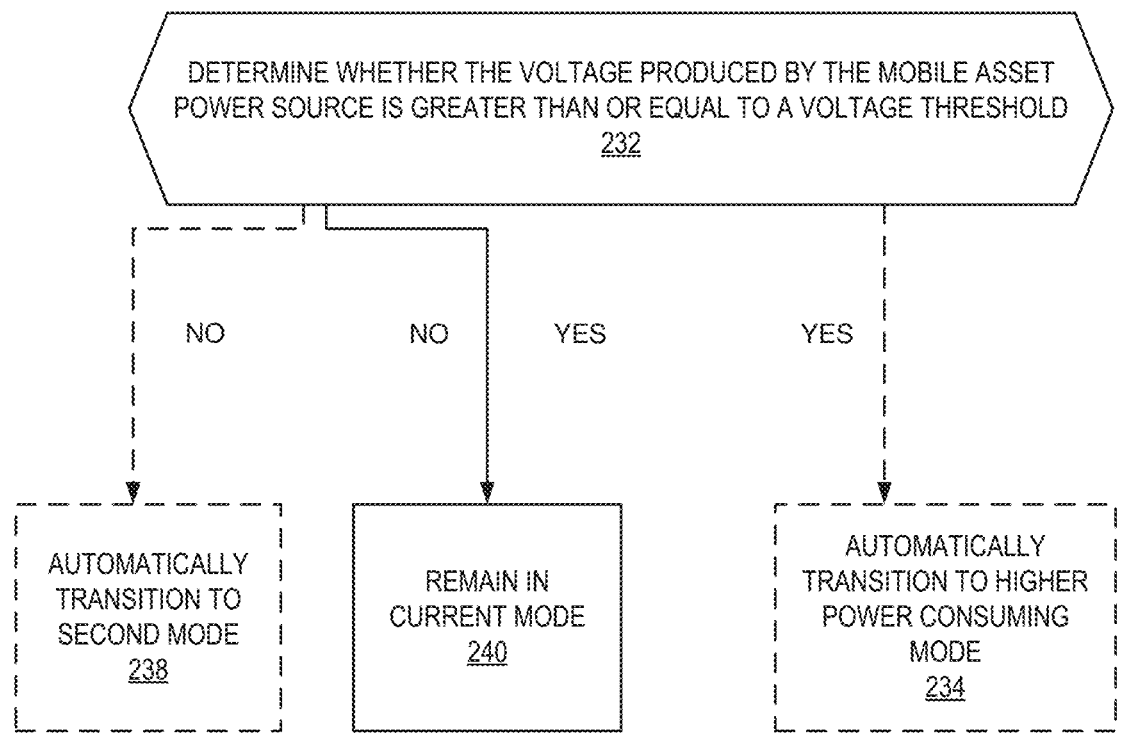
FIG. 2B illustrates a flow diagram of exemplary operations that can be performed for transitioning from a mode of operations of the gateway system to another mode of operation of the gateway system based upon a voltage threshold, according to some example embodiments.

The operations in the flow diagrams of FIGS. 2A-B are described with reference to the exemplary embodiments in FIGS. 1A-D and 3, 4, and 5. However, the operations of the flow diagrams FIGS. 2A-B can be performed by embodiments other than those discussed with reference to the other FIGS. 1A-D and 3, 4, and 5, and the embodiments discussed with reference to these FIGS. 1A-D and 3, 4, and 5 can perform operations different than those discussed with reference to the flow diagrams of FIGS. 2A-B. While in some embodiments, the operations described herein are performed by a gateway system implemented as either one of the gateway system 310 or 410, in other embodiments, the operations can be performed by gateway systems with varying implementations.

FIG. 2A illustrates a flow diagram of exemplary operations that can be performed in a gateway system for transitioning from a mode of operation to another mode of operation of the gateway system, in accordance with some embodiments. At operation 202, the gateway system 110 monitors a voltage produced by a power system of the mobile asset. The flow of operations moves to operation 204, at which the gateway system 110 determines that a first fluctuation occurs in the voltage produced by the power system of the mobile asset over a first interval of time. The first fluctuation in an increase in the voltage produced by the external power source which exceeds a voltage threshold. In some embodiments, the first interval of time exceeds a time threshold. Upon determining that the first fluctuation occurred, the gateway system operations in a first mode. As described above with reference to FIG. 1A, the first mode is a high-power consuming mode of operation and is a full mode of operation that causes all of the components of the gateway system 110 to be turned on. The flow of operations then moves to operation 208, at which the gateway system 110 determines that a value of the voltage produced by the power system of the mobile asset is less than a voltage threshold. Upon determining that a value of the voltage produced by the power system of the mobile asset is less than a voltage threshold, the flow of operations moves to operation 210, at which the gateway system automatically transitions to operate in a second mode that is different from the first mode, and causes the gateway system to consume less power than when it is operating in the first mode.

FIG. 2B illustrates a flow diagram of exemplary operations that can be performed for transitioning from a mode of operations of the gateway system to another mode of operation of the gateway system based upon a voltage threshold. In some embodiments, the operations of FIG. 2B are performed as part of other operations that occur when the gateway system 110 attempts to transition to a higher power consumption mode in response to other inputs (e.g., fluctuation in voltage produced by the mobile asset power mode (such as a decrease in the voltage), a GPS reading, accelerometer measurement, mobile asset diagnostics message, etc.). In this embodiment, the operation 232-240 are performed. In other embodiments, the operations of FIG. 2B are performed regardless of whether there was an attempt to transition to a higher power consumption mode. In this second embodiment, the operations 232, 236-240 can be performed without operation 234 being performed. For example, a gateway system 110, when operating in the first mode 161 or in the third mode 163, may periodically analyze the voltage produced by the external power source to determine whether the voltage produced by the external power source is less than to the voltage threshold. The frequency of this determination can be configurable and may vary based on the type of external power source, the type of mobile asset, and/or the application. In some embodiments, this determination is performed each time a voltage produced by the external power source is read (e.g., by the ADC 344). In other embodiments, this determination is performed at a given frequency that is different from the frequency at which the voltage produced by the external power source is read. While in some embodiments, the operations of FIG. 2B are performed by the controller 330 upon receipt of the voltage produced by the external power source from the ADC 344, in other embodiments, the operations of FIG. 2B are performed by the processor(s) 405 upon receipt of the voltage produced by the external power source.

In some embodiments, the voltage threshold is determined based on a power curve for the external power source. A power curve represents a variation in the voltage produced by the external power source as it is charged or discharged. In some embodiments, there exist a point along the power curve for each type of external power source and/or mobile asset below which a gateway system's attempt to boot may result in a reset of the gateway system. In other words, this point represents an average voltage at which successfully booting a gateway system becomes unreliable. Thus, the voltage of the external power source needs to be a safe margin beyond the point described above for the gateway system to boot in a reliable manner In some embodiments, this safe margin takes into account the fact that the gateway system powering off will result in an increase in the voltage of the mobile asset's power system because the gateway system will no longer be drawing power. By way of a specific example, if one assumes that the gateway system powers off because the voltage produced by the external power system is too low, and responsive to this powering off: 1) the voltage of the mobile asset's power system increases: 2) the gateway system attempts to boot because the gateway detects this voltage increase; 3) the booting process fails because the voltage is too low; and the process repeats. This "ping pong" effect is avoided, in some embodiments, by selecting a voltage threshold that is greater than the point along the battery curve described above. While in one embodiment, for a 12V external power system, the voltage threshold is 8 volts, the voltage threshold may alternatively be in the range of 7 to 12V. In mobile assets with a different voltage power system (e.g., some electric mobile assets have a 48V power system), the range would be different. While in some embodiments the voltage threshold is preconfigured or configurable by the end-user, in other embodiments different voltage thresholds are selected for different gateway systems based on a set of one or more criteria, such as different types of external power system, different types of mobile assets, different operating environments (e.g., based upon geographic location), etc. While selection of voltage threshold may be performed in a variety of different ways, in some embodiments, a look-up table is generated that identifies different voltage threshold based upon the set of criteria; and each gateway system determines their values for the set of criteria, and then look up the corresponding voltage threshold to use in the look-up table. This look-up table may be stored in each gateway, and optionally updated responsive to certain events and/or a timetable. Alternatively, this look-up table may be stored in a cloud system (e.g., the management server 140), and the corresponding voltage thresholds are pushed to or pulled to each gateway system. In other embodiments, the voltage threshold can be selected by a user to enable the gateway system to transition to a lower power mode earlier than it would in a default configuration scenario.

In the first embodiment, at operation 232, the gateway system 110 determines whether the voltage produced by the external power source is greater than or equal to a voltage threshold. Upon determination that the voltage produced by the external power source is greater than or equal to the voltage threshold, the flow of operations moves to operation 234, at which the gateway system 110 transitions to a higher power consuming mode. Alternatively, upon determination that the voltage produced by the external power source is not greater than or equal to (i.e., is lower than) the voltage threshold, the gateway system does not transition to a higher power consuming mode. For example, when the gateway system 110 is in the second mode 162 the gateway system 110 does not transition to the first mode 161 or the third mode 163; and when the gateway system 110 is in the third mode, it does not transition to the first mode 161. While in some embodiments, the determination that the voltage is lower than the voltage threshold causes the gateway system 110 to remain (operation 240) in its current mode (e.g., the second mode 162 or the third mode 163), in other embodiments, the determination that the voltage is lower than the voltage threshold causes the gateway system 110 to transition (operation 238) to the lowest power consuming mode (e.g., the second mode 162).

In the second embodiment, at operation 232, the gateway system 110 determines whether the voltage produced by the external power source is greater than or equal to a voltage threshold. Upon determination that the voltage produced by the external power source is greater than or equal to the voltage threshold, the flow of operations moves to operation 240, at which the gateway system 110 remains in its current mode. Alternatively, upon determination that the voltage produced by the external power source is not greater than and not equal to the voltage threshold, the flow of operations moves to operation 238, at which the gateway system 110 transitions to the lowest power consuming mode (e.g., the second mode 162).

The embodiments described herein present several advantages when compared with other mechanisms of power management for gateway systems. The mechanisms presented herein enable the gateway system 110 to use the power from the external power source without draining the external power source and ensure that a mobile asset can be turned on even after a period of time has elapsed without the mobile asset's engine being turned on. For example, a mobile asset is able to start after 1 or 2 months of being off (i.e., without having the engine turned on) and having a gateway system connected to it. The mechanisms presented herein further allow to extend the life of the internal power source of a gateway system when this internal power source is not receiving power from the external power source. In some embodiments, the gateway system is operative to soft shutdown (e.g., transmitting data and a goodbye message) after its power source being completely drained and being plugged back to the external power source for a limited amount of time (e.g., for 30 minutes or 45 minutes). Thus, the gateway system is operative to charge its internal power source to a level that is sufficient to allow operations of the cellular network interface for transmission of a goodbye message to the management server 140 without a brown-out occurring in the voltage produced by the external power source. Further, in some embodiments, the mechanisms presented herein allow the gateway system to periodically turn on to transmit location information and/or sensor measurements even if not plugged to the external power source or if mobile asset is not in motion. These embodiments allow localization of a trailer and/or a mobile asset (snowplow) after a period of time (e.g., few months or few weeks) even if the mobile asset hasn't been in use for that period of time. Further, the embodiments described herein allow a controller and a processing unit to share a hardware resource through a mechanism that allows the automatic release of the control of the shared resource when automatic transitions of modes of operation occur in the gateway system.

Exemplary Electronic Devices

Electronic Device and Machine-Readable Media

One or more parts of the above embodiments may include software and/or a combination of software and hardware. An electronic device (also referred to as a computing device, computer, etc.) includes hardware and software, such as a set of one or more processors coupled to one or more machine-readable storage media (e.g., magnetic disks, optical disks, read only memory (ROM), flash memory, phase change memory, solid state drives (SSDs)) to store code (which is composed of software instructions and which is sometimes referred to as computer program code or a computer program) for execution on the set of processors and/or to store data. For instance, an electronic device may include non-volatile memory (with slower read/write times, e.g., magnetic disks, optical disks, read only memory (ROM), Flash memory, phase change memory, SSDs) and volatile memory (e.g., dynamic random access memory (DRAM), static random access memory (SRAM)), where the non-volatile memory persists code/data even when the electronic device is turned off, or when power is otherwise removed, and the electronic device copies that part of the code that is to be executed by the set of processors of that electronic device from the non-volatile memory into the volatile memory of that electronic device during operation because volatile memory typically has faster read/write times. As another example, an electronic device may include a non-volatile memory (e.g., phase change memory) that persists code/data when the electronic device is turned off, and that has sufficiently fast read/write times such that, rather than copying the part of the code/data to be executed into volatile memory, the code/data may be provided directly to the set of processors (e.g., loaded into a cache of the set of processors); in other words, this non-volatile memory operates as both long-term storage and main memory, and thus the electronic device may have no or only a small amount of volatile memory for main memory. In addition to storing code and/or data on machine-readable storage media, typical electronic devices can transmit code and/or data over one or more machine-readable transmission media (also called a carrier) (e.g., electrical, optical, radio, acoustical or other form of propagated signals—such as carrier waves, infrared signals). For instance, typical electronic devices also include a set of one or more physical network interface(s) to establish network connections (to transmit and/or receive code and/or data using propagating signals) with other electronic devices. Thus, an electronic device may store and transmit (internally and/or with other electronic devices over a network) code and/or data with one or more machine-readable media (also referred to as computer-readable media).

Electronic devices are used for a variety of purposes. For example, an electronic device (sometimes referred to as a server electronic device) may execute code that cause it to operate as one or more servers used to provide a service to other electronic device(s) (sometimes referred to as a client electronic device, a client computing device, or a client device) that executes client software (sometimes referred to as client code or an end-user client) to communicate with the service. The server and client electronic devices may be operated by users respectively in the roles of administrator (also known as an administrative user) and end-user.

Alternative embodiments of an electronic device may have numerous variations from that described above. For example, customized hardware and/or accelerators might also be used in an electronic device.

Exemplary Environment

FIG. 3 illustrates a block diagram for an exemplary gateway system that can be used in some embodiments. The gateway system 310 includes a processing unit 320 and a controller 330. The processing unit 320 is operative to control a location sensor and a cellular communication interface 316. The location sensor can be built-in into the processing unit 320, such as location sensor 312A, or an external location sensor 312B coupled to the processing unit 320. In some embodiments, the location sensor can be a global positioning system (GPS) sensor. In some embodiments, the location sensor 312B is coupled with an inertial measurement unit (IMU) 313B, which, when used in combination, enables the location sensor to output a location of the gateway system 310 (GPS coordinate). The controller 330 is coupled with the processing unit 320 through the first bus 333. In some embodiments, the first bus is a synchronous serial communication interface specification used for short-distance communication between the controller 330 and the processing unit 320. As a non-limiting example, the first bus can be a Serial Peripheral Interface (SPI). The controller 330 is further coupled with an IMU 313A through a second bus that is shared with the processing unit 320. The processing unit 320 is further coupled through the second bus to the controller 330 and to the IMU 313A. In a non-limiting example, the second bus can be implemented via a serial protocol (e.g., I2C) for two-wire interface to connect low-speed devices such as microcontrollers, EEPROMs, A/D and D/A converters, I/O interfaces and other similar peripherals in embedded systems.

The controller 330 is coupled with a diagnostics port 360. The diagnostics port 360 enables the gateway system 310 to connect with, receive messages from and/or transmit messages to the diagnostics system through this port. The controller 330 is further coupled with an ADC 344 that enables the controller 330 to read the voltage produced by the external power system 380 as received through the charge control integrated circuit (charge IC) 350. The charge IC 350 is coupled with a power supply circuitry 340 enabling to supply power received from the external power system 380 (in particular from the external power source 382) to the components of the gateway system 310. In some embodiments, the power supply circuitry 340 may be separate from the charge IC 350 and the processing unit 320. Alternatively, the power supply circuitry 340 can be included in the charge IC 350 or in the processing unit 320. The power is supplied to the controller 330 and to the processing unit 320 (e.g., when the gateway system is operating in the first mode). In some embodiments, the power is supplied only to the controller 330 (e.g., when the gateway system is operating in the second mode or in the third mode). In some embodiments, when the gateway system is in the third mode the power can be supplied to both the processing unit 320 and the controller 330 or only to the controller 330, depending on which one of the low mode or the high mode are selected as a third mode for the gateway system 310. The controller 330 and the processing unit 320 are coupled with an internal power source (e.g., internal battery) 370. The internal power source 370 is charged when power is received from the external power system 380. In some embodiments, the power source 370 allows the gateway system 310 to operate in one of the modes (e.g., the second mode or the third mode) when no power is received from the external power system 380.

While in some embodiments, the processing unit 320 is coupled with one or more other communication interfaces (such as Wi-Fi, Bluetooth (BT), BLE, USB, etc.), in other embodiments, the processing unit 320 is not coupled with other interfaces. While in some embodiments, the processing unit 320 is coupled with one or more additional sensors (e.g., temperature sensor, humidity sensor, barometric pressure sensor, CO2 concentration sensor, acceleration sensor, sound sensor, movement sensor, etc.), in other embodiments, the processing unit 320 is not coupled with other additional sensors. In some embodiments, one or more of the additional sensors can be integrated into the gateway system 310. In other embodiments, one or more of the additional sensors can be separate from the gateway system 310. When an additional sensor is separate from the gateway system 310, it can connect to the gateway system 310 through a wireless communication interface (e.g., a short-range communication interface such as BT or BLE, or other) or alternatively it can connect via a wired communication interface (e.g., a general-purpose input/output (GPIO)). The processing unit 320 is a high-power consuming processing unit that is operative to control multiple components of the gateway system 310 (e.g., components 312A or 312B, 313B, 314, 315, 316). While some components are illustrated as being located outside of the processing unit 320, in other embodiments, some or all of these elements can be integrated within the processing unit 320.

In some embodiments, when the processing unit 320 is powered (i.e., power is supplied to it from the external power system), all of the components controlled by the processing unit 320 are powered and operational. For example, when the gateway system 310 is operating in the first mode 161, all components of the gateway system 310 are on, including the processing unit 320 and the components controlled by the processing unit 320. In some embodiments, when the processing unit 320 is powered (i.e., power is supplied to it from the external power system), some of the components controlled by the processing unit 320 can be turned off. For example, when the gateway system 310 is operating in the high mode 163A, some components of the gateway system 310 are on, including the processing unit 320, and some of the components controlled by the processing unit 320 (e.g., location sensor 312A or 312B), and other components controlled by the processing unit 320 are turned off (e.g., other comm. interfaces 314). While not illustrated in FIG. 3, the gateway system 310 includes non-transitory computer readable media. to one or more machine-readable storage media (e.g., magnetic disks, optical disks, read only memory (ROM), flash memory, phase change memory, solid state drives (SSDs)) to store code (which is composed of software instructions and which is sometimes referred to as computer program code or a computer program) for execution on the set of processors and/or to store data. For instance, an electronic device may include non-volatile memory (with slower read/write times, e.g., magnetic disks, optical disks, read only memory (ROM), Flash memory, phase change memory, SSDs) and volatile memory (e.g., dynamic random access memory (DRAM), static random access memory (SRAM)), where the non-volatile memory persists code/data even when the electronic device is turned off, or when power is otherwise removed, and the electronic device copies that part of the code that is to be executed by the set of processors of that electronic device from the non-volatile memory into the volatile memory of that electronic device during operation because volatile memory typically has faster read/write times. As another example, an electronic device may include a non-volatile memory (e.g., phase change memory) that persists code/data when the electronic device is turned off, and that has sufficiently fast read/write times such that, rather than copying the part of the code/data to be executed into volatile memory, the code/data may be provided directly to the set of processors (e.g., loaded into a cache of the set of processors); in other words, this non-volatile memory operates as both long-term storage and main memory, and thus the electronic device may have no or only a small amount of volatile memory for main memory.

In contrast to the processing unit 320, the controller 330 is a low power consumption component that is used at least in part to control the operation of the processing unit 320. The controller 330 is operative to turn on and off the processing unit 320, depending on the mode of operation of the gateway system 310. The processing unit 320 includes a mode of operation manager 332 that automatically transitions the gateway system 310 from one mode to another mode of operations based on one or more inputs (e.g., voltage fluctuation, voltage level, and/or other internal inputs) as described above with respect to FIGS. 1A-D and FIGS. 2A-B.

Figure 4:
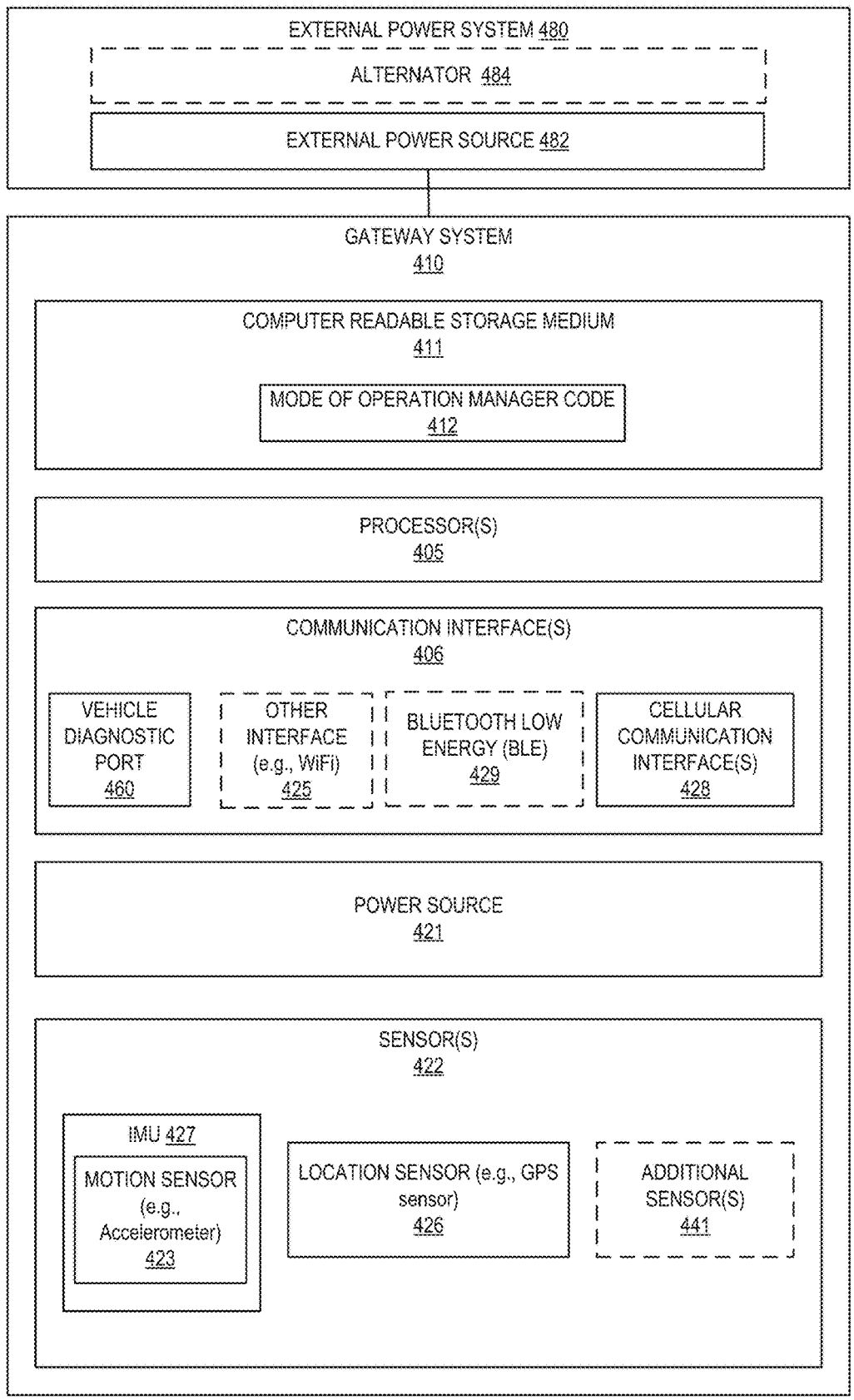
FIG. 4 illustrates a block diagram for an exemplary gateway system that can be used in some embodiments.

FIG. 4 illustrates a block diagram for another exemplary gateway system that can be used in some embodiments. Gateway system 410 includes one or more processors 405 and connected system components (e.g., multiple connected chips). The gateway system 410 includes computer-readable storage medium 411, which is coupled to the processor(s) 405. The computer-readable storage medium 411 may be used for storing data, metadata, and programs for execution by the processor(s) 405. For example, the depicted computer-readable storage medium 411 may store data capture code 1008 that, when executed by the processor(s) 405, causes the gateway system 410 (e.g., gateway system 110) to transmit the data to the management server 140.

The gateway system 410 also includes one or more sensors used to record sensor measurements in response to physical events. For example, the gateway system 410 includes a location sensor (such as a GPS sensor) 423 for recording location readings to indicate the location of the mobile asset on which the gateway system is mounted. The gateway system 410 includes an IMU 427, which includes a motion sensor 423, such as an accelerometer and is used to determine a measure of the motion of the mobile asset on which the gateway system 410 is mounted. The gateway system 410 may include one or more additional sensors 441 (e.g., temperature sensor, humidity sensor, barometric pressure sensor, $CO_2$ concentration sensor, acceleration sensor, sound sensor, movement sensor, etc.). In some embodiments, one or more of the additional sensors can be integrated into the gateway system 410. In other embodiments, one or more of the additional sensors can be separate from the gateway system 410. When an additional sensor is separate from the gateway system 410, it can connect to the gateway system 410 through a wireless communication interface (e.g., a short-range communication interface such as BT or BLE, or other) or alternatively it can connect via a wired communication interface (e.g., a general-purpose input/output (GPIO)).

The gateway system 410 also includes one or more communication interfaces 406, which are provided to allow a user to provide input to, receive output from, and otherwise transfer data to and from the system. Exemplary Input/Output devices and interfaces include wired and wireless transceivers, such as Joint Test Action Group (JTAG) transceiver, a Bluetooth Low Energy (LE) transceiver 429 an IEEE 802.11 transceiver, an infrared transceiver, a wireless cellular communication interface (e.g., 2G, 3G, 4G, 5G, etc.) 428, a diagnostic port 460, or another wireless protocol 425 to connect the gateway system 410 with another device, external component, or a network, and receive stored instructions, data, tokens, etc. It will be appreciated that one or more buses may be used to interconnect the various components shown in FIG. 4. The gateway system 410 includes a power source 421.

It will be appreciated that additional components, not shown, may also be part of the gateway system 410, and, in certain embodiments, fewer components than that shown in FIG. 10, may also be used in a gateway system 410.

Figure 5:
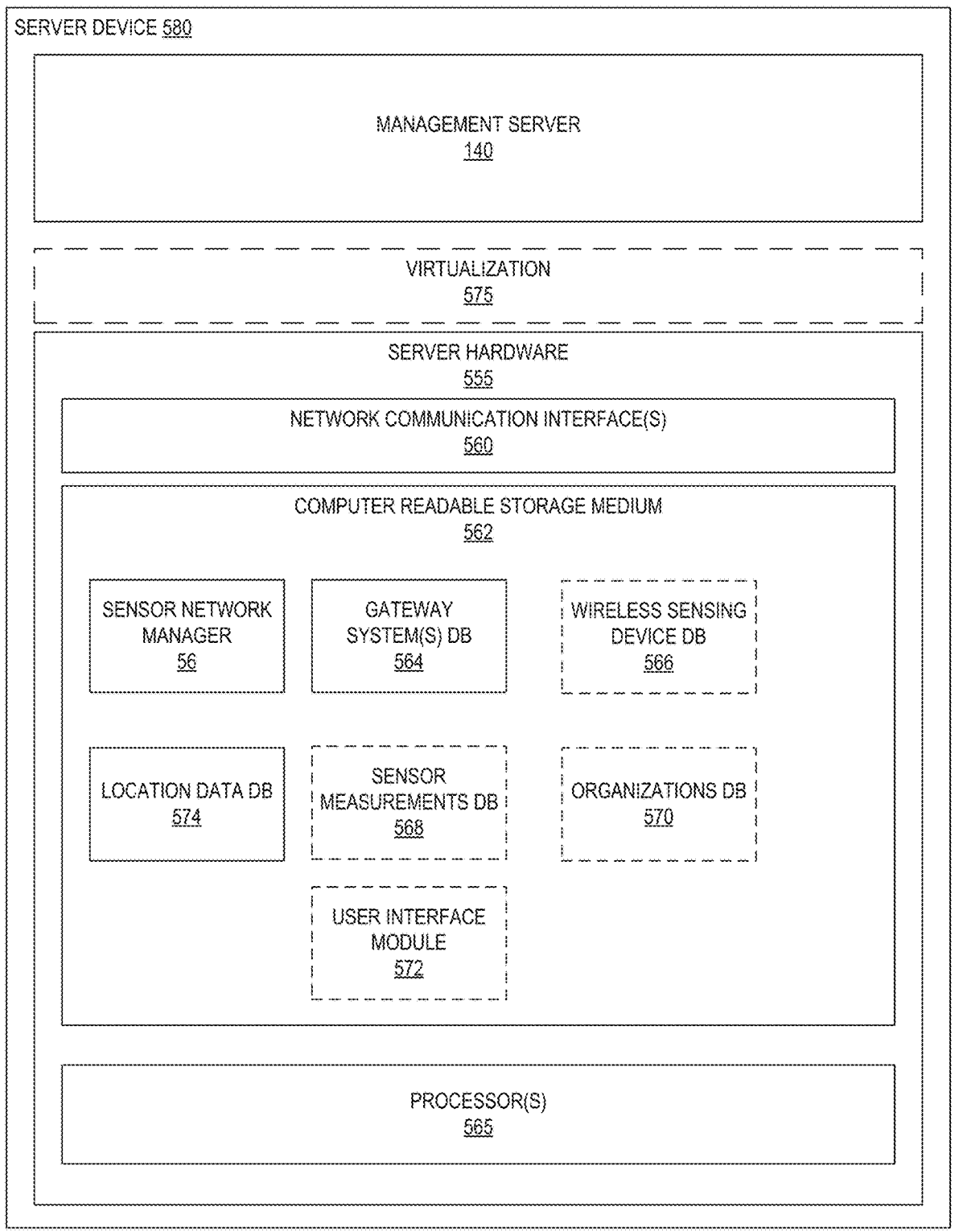
FIG. 5 illustrates a block diagram for an exemplary server management that can be used in some embodiments.

FIG. 5 illustrates a block diagram for an exemplary management server that can be used in some embodiments. Management server 140 may be a web or cloud server, or a cluster of servers, running on server hardware. In one embodiment, the management server 140 works for both single and multi-tenant installations, meaning that multiple organizations with different administrators may have wireless sensing devices and/or gateway systems managed by the same management server.

According to one embodiment, management server 140 is implemented on a server device 580 which includes server hardware 555. Server hardware 555 includes network communication interfaces 560 coupled with one or more processor(s) 565, and a computer-readable storage medium 562. The computer-readable storage medium 562 includes a sensor network manager 563 used to configure and manage the gateway system(s) (e.g., gateway system 110) and/or wireless sensing device(s) for each organization. For example, the sensor network manager 563 may include a registration module which receives and manages information related to the gateway systems and/or the WSD(s) that belong to an organization. The sensor network manager 563 may also include a claiming module which is used when devices are claimed by the organization (e.g., the claiming may be performed at least in part by populating the gateway system database 564, the wireless sensing device database 566, and the organization database 570 with appropriate information when the WSDs and gateway systems are associated to an organization).

In an embodiment, the computer-readable storage medium 562 further includes a user interface module 572, which when executed on the processor(s) 565 causes the display of a Web interface on a client device. The Web interface allows administrators and/or users to create and log into an account associated with an organization to which a set of gateway systems belong (e.g., gateway system 110). A set of WSDs can also belong to the organization and the user interface module 572 can be used for managing and configuring the gateway systems and the WSDs. The computer readable storage medium 562 further includes the location data database 574 (including location data received from the gateway system(s)), an optional sensor measurements database 568 (including data indicative of sensor measurements received from the gateway systems), a gateway systems database 564 (including information regarding the gateway systems), an optional wireless sensing device database 566 (including information regarding the WSDs), and an optional organizations database 570 (including information regarding the organizations to which the WSDs and/or gateway systems belong).

While one embodiment does not implement virtualization, alternative embodiments may use different forms of virtualization—represented by a virtualization layer 575. In these embodiments, the management server 140, and the hardware that executes it, form a virtual management server which is a software instance of the modules stored on the computer-readable storage medium 562. In electronic devices that use compute virtualization, the set of one or more processor(s) 565 typically execute software to instantiate the virtualization layer 575 and software container(s) (e.g., with operating system-level virtualization, the virtualization layer 575 represents the kernel of an operating system (or a shim executing on a base operating system) that allows for the creation of multiple software containers (representing separate user space instances and also called virtualization engines, virtual private servers, or jails) that may each be used to execute a set of one or more applications; with full virtualization, the virtualization layer 575 represents a hypervisor (sometimes referred to as a virtual machine monitor (VMM)) or a hypervisor executing on top of a host operating system, and the software containers, each represent a tightly isolated form of a software container called a virtual machine that is run by the hypervisor and may include a guest operating system; with para-virtualization, an operating system or application running with a virtual machine may be aware of the presence of virtualization for optimization purposes). Again, in electronic devices where compute virtualization is used, during operation an instance of the software is executed within the software container on the virtualization layer 575. In electronic devices where compute virtualization is not used, the instance on top of a host operating system is executed on the "bare metal" electronic device. The instantiation of the instance, as well as the virtualization layer and software containers, if implemented, are collectively referred to as software instance(s). The server device 580 can be used to perform the operations of a management server as described with reference to FIGS. 1A-2B.

While some components of the gateway system or the management server are illustrated as code stored on the computer-readable storage medium, in other embodiments the modules may be implemented in hardware or in a combination of hardware and software.

CONCLUSION

In the above description, numerous specific details such as resource partitioning/sharing/duplication embodiments, types and interrelationships of system components, and logic partitioning/integration choices are set forth in order to provide a more thorough understanding. It will be appreciated, however, by one skilled in the art, that the invention may be practiced without such specific details. In other instances, control structures, logic embodiments, opcodes, means to specify operands, and full software instruction sequences have not been shown in detail since those of ordinary skill in the art, with the included descriptions, will be able to implement what is described without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Bracketed text and blocks with dashed borders (e.g., large dashes, small dashes, dot-dash, and dots) may be used herein to illustrate optional operations and/or structures that add additional features to some embodiments. However, such notation should not be taken to mean that these are the only options or optional operations, and/or that blocks with solid borders are not optional in certain embodiments.

In the following description and claims, the term "coupled," along with its derivatives, may be used. "Coupled" is used to indicate that two or more elements, which may or may not be in direct physical or electrical contact with each other, co-operate or interact with each other.

The operations in the flow diagrams are be described with reference to the exemplary embodiments in the other figures. However, the operations of the flow diagrams can be performed by embodiments other than those discussed with reference to the other figures, and the embodiments discussed with reference to these other figures can perform operations different from those discussed with reference to the flow diagrams.

While the flow diagrams in the figures show a particular order of operations performed by certain embodiments, it should be understood that such order is exemplary (e.g., alternative embodiments may perform the operations in a different order, combine certain operations, overlap certain operations, etc.).

While the above description includes several exemplary embodiments, those skilled in the art will recognize that the invention is not limited to the embodiments described and can be practiced with modification and alteration within the spirit and scope of the appended claims. The description is thus illustrative instead of limiting.

What is claimed is:

1. A method in a gateway system of a mobile asset, the method comprising:
   monitoring, at the gateway system, a voltage produced by a power system of the mobile asset;
   determining, based on first sensor measurements, whether the mobile asset is in motion;
   responsive to determining that a first fluctuation occurs in the voltage produced by the power system of the mobile asset over a first interval of time and determining, based on the first sensor measurements, that the mobile asset is in motion, operating in a first mode of a plurality of modes, wherein the plurality of modes also includes a second mode and a third mode;
   responsive to determining that a value of the voltage produced by the power system of the mobile asset is less than a voltage threshold, automatically transitioning to operating in the second mode, which is different from the first mode and causes the gateway system to consume less power than when it is operating in the first mode; and
   responsive to determining that a second fluctuation occurs in the voltage produced by the power system of the mobile asset over a second interval of time and determining, based on second sensor measurements, that the mobile asset is not in motion, transitioning from operating in the second mode to operating in the third mode, wherein one or more functionalities of the gateway system that are turned off when the gateway system is operating in the second mode are turned on when the gateway system is operating in the third mode.

2. The method of claim 1, wherein the first fluctuation is an increase in the voltage produced by the power system of the mobile asset over the first interval of time that exceeds a threshold indicating that an engine of the mobile asset has been turned on.

3. The method of claim 1, wherein the determining that the value of the voltage produced by the power system of the mobile asset is less than the voltage threshold includes determining that no power is received from the power system of the mobile asset.

4. The method of claim 1, wherein the gateway system includes:
   a controller coupled with a processing unit; and
   the processing unit, which is operative to control a cellular communication interface and a location sensor.

5. The method of claim 4 further comprising:
   when the gateway system is operating in the first mode, performing the following:
      responsive to determining, based on third sensor measurements, that the mobile asset is not in motion, transitioning to operating in the third mode, wherein the third mode causes the gateway system to consume less power than when it is operating in the first.

6. The method of claim 5, wherein the operating in a third mode includes:
   powering off the processing unit causing the location sensor to be turned off while the controller continues to receive power from the power system of the mobile asset.

7. The method of claim 5, wherein the processing unit is further operative to control one or more additional communication interfaces, and the operating in the third mode includes:
   causing the additional communication interfaces to be turned off.

8. The method of claim 4, wherein the controller and the processing unit share a hardware resource and the transitioning to the second mode causes the processing unit to release control of the shared resource to the controller.

9. The method of claim 1 further comprising:
   determining that the voltage produced by the power system of the mobile asset is greater than or equal to a voltage threshold; and
   wherein the operating in the first mode is further performed in response to determining that the voltage produced by the power system of the mobile asset is greater than or equal to the voltage threshold.

10. A non-transitory machine-readable storage medium that provides instructions that, if executed by a processor of a gateway system of a mobile asset, will cause said gateway system to perform operations comprising:
   monitoring, at the gateway system, a voltage produced by a power system of the mobile asset;
   determining, based on first sensor measurements, whether the mobile asset is in motion;
   responsive to determining that a first fluctuation occurs in the voltage produced by the power system of the mobile asset over a first interval of time and determining, based on the first sensor measurements, that the mobile asset is in motion, operating in a first mode of a plurality of modes, wherein the plurality of modes also includes a second mode and a third mode;
   responsive to determining that a value of the voltage produced by the power system of the mobile asset is less than a voltage threshold, automatically transitioning to operating in the second mode, which is different from the first mode and causes the gateway system to consume less power than when it is operating in the first mode; and
   responsive to determining that a second fluctuation occurs in the voltage produced by the power system of the mobile asset over a second interval of time and determining, based on second sensor measurements, that the mobile asset is not in motion, transitioning from operating in the second mode to operating in the third mode, wherein one or more functionalities of the gateway system that are turned off when the gateway system is operating in the second mode are turned on when the gateway system is operating in the third mode.

11. The non-transitory machine-readable storage medium of claim 10, wherein the first fluctuation is an increase in the voltage produced by the power system of the mobile asset over the first interval of time that exceeds a threshold indicating that an engine of the mobile asset has been turned on.

12. The non-transitory machine-readable storage medium of claim 10, wherein the determining that the value of the voltage produced by the power system of the mobile asset is less than the voltage threshold includes determining that no power is received from the power system of the mobile asset.

13. The non-transitory machine-readable storage medium of claim 10, wherein the gateway system includes:
   a controller coupled with a processing unit; and
   the processing unit, which is operative to control a cellular communication interface and a location sensor.

14. The non-transitory machine-readable storage medium of claim 13, wherein the operations further comprise:
   when the gateway system is operating in the first mode, performing the following:
      responsive to determining, based on third sensor measurements, that the mobile asset is not in motion, transitioning to operating in the third mode, wherein the third mode causes the gateway system to consume less power than when it is operating in the first mode.

15. The non-transitory machine-readable storage medium of claim 14, wherein the operating in a third mode includes:
   powering off the processing unit causing the location sensor to be turned off while the controller continues to receive power from the power system of the mobile asset.

16. The non-transitory machine-readable storage medium of claim 14, wherein the processing unit is further operative to control one or more additional communication interfaces, and the operating in the third mode includes:
   causing the additional communication interfaces to be turned off.

17. The non-transitory machine-readable storage medium of claim 13, wherein the controller and the processing unit share a hardware resource and the transitioning to the second mode causes the processing unit to release control of the shared resource to the controller.

18. The non-transitory machine-readable storage medium of claim 10, wherein the operations further comprise:
   determining that the voltage produced by the power system of the mobile asset is greater than or equal to a voltage threshold; and
   wherein the operating in the first mode is further performed in response to determining that the voltage produced by the power system of the mobile asset is greater than or equal to the voltage threshold.

19. A gateway system comprising:
   a non-transitory machine-readable storage medium that provides instructions that, if executed by a controller will cause the gateway system to perform operations comprising,
      monitoring, at the gateway system, a voltage produced by a power system of a mobile asset,
      determining, based on first sensor measurements, whether the mobile asset is in motion,
      responsive to determining that a first fluctuation occurs in the voltage produced by the power system of the mobile asset over a first interval of time and determining, based on the first sensor measurements, that the mobile asset is in motion, operating in a first mode of a plurality of modes, wherein the plurality of modes also includes a second mode and a third mode,
      responsive to determining that a value of the voltage produced by the power system of the mobile asset is less than a voltage threshold, automatically transitioning to operating in the second mode that is different from the first mode and causes the gateway system to consume less power than when it is operating in the first mode, and
      responsive to determining that a second fluctuation occurs in the voltage produced by the power system of the mobile asset over a second interval of time and determining, based on second sensor measurements, that the mobile asset is not in motion, transitioning from operating in the second mode to operating in the third mode, wherein one or more functionalities of the gateway system that are turned off when the gateway system is operating in the second mode are turned on when the gateway system is operating in the third mode.

20. The gateway system of claim 19, wherein the first fluctuation is an increase in the voltage produced by the power system of the mobile asset over the first interval of time that exceeds a threshold indicating that an engine of the mobile asset has been turned on.

21. The gateway system of claim 19, wherein the determining that the value of the voltage produced by the power system of the mobile asset is less than the voltage threshold includes determining that no power is received from the power system of the mobile asset.

22. The gateway system of claim 19, wherein the gateway system further includes a processing unit coupled with the controller, wherein the processing unit is operative to control a cellular communication interface and a location sensor.

23. The gateway system of claim 22, wherein the operations further comprise:
when the gateway system is operating in the first mode, performing the following:
responsive to determining, based on third sensor measurements, that the mobile asset is not in motion, transitioning to operating in the third mode, wherein the third mode causes the gateway system to consume less power than when it is operating in the first mode.

24. The gateway system of claim 23, wherein the operating in a third mode includes:
powering off the processing unit causing the location sensor to be turned off while the controller continues to receive power from the power system of the mobile asset.

25. The gateway system of claim 23, wherein the processing unit is further operative to control one or more additional communication interfaces, and the operating in the third mode includes:
causing the processing unit to power off additional communication interfaces.

26. The gateway system of claim 22, wherein the controller and the processing unit share a hardware resource and the transitioning to the second mode causes the processing unit to release control of the shared resource to the controller.

27. The gateway system of claim 19, wherein the operations further comprise:
determining that the voltage produced by the power system of the mobile asset is greater than or equal to a voltage threshold; and
wherein the operating in the first mode is further performed in response to determining that the voltage produced by the power system of the mobile asset is greater than or equal to the voltage threshold.

* * * * *